(12) United States Patent
Yamaguchi

(10) Patent No.: US 6,627,939 B2
(45) Date of Patent: Sep. 30, 2003

(54) SEMICONDUCTOR DEVICE PROVIDED WITH A CAPACITOR HAVING A HIGH-PERMITTIVITY INSULATOR FILM

(75) Inventor: Hiromu Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 131 days.

(21) Appl. No.: 09/732,703

(22) Filed: Dec. 11, 2000

(65) Prior Publication Data

US 2001/0003664 A1 Jun. 14, 2001

(30) Foreign Application Priority Data

Dec. 9, 1999 (JP) .......................... 11-350894

(51) Int. Cl.$^7$ .......................... H01L 21/70; H01L 27/04
(52) U.S. Cl. .......................... 257/301; 257/296; 257/306; 257/310
(58) Field of Search .............. 106/287.18; 118/715, 118/724; 257/295–298, 301, 306, 308–310

(56) References Cited

U.S. PATENT DOCUMENTS 4,937,650 A * 6/1990 Shinriki et al. ............. 257/296
5,195,018 A * 3/1993 Kwon et al. ................. 361/313

FOREIGN PATENT DOCUMENTS

| JP | 63-213148 A | 9/1988 |
| JP | 2-226754 A | 9/1990 |
| JP | 5-109982 A | 4/1993 |
| JP | 5-198743 | 8/1993 |
| JP | 7-14992 | 1/1995 |
| JP | 7-14992 A | 1/1995 |
| JP | 7-202019 A | 8/1995 |
| JP | 7-263572 A | 10/1995 |
| JP | 10-79478 A | 3/1998 |

* cited by examiner

Primary Examiner—Minh Loan Tran
Assistant Examiner—Thomas L Dickey
(74) Attorney, Agent, or Firm—Sughrue Mion, PLLC

(57) ABSTRACT

In a disclosed semiconductor device, a capacitor includes a lower electrode consisting essentially of titanium nitride, a first capacity insulator film consisting of a tantalum oxide film formed on the lower electrode, a second capacity insulator film consisting of a titanium oxide film formed to a thickness of 0.2 to 1.9 nm on an interface of the first capacity insulator film and the lower electrode, and an upper electrode consisting of a titanium nitride film formed on the first capacity insulator film in such a configuration that the lower electrode is connected to an N-type diffused region via a capacity contact.

8 Claims, 17 Drawing Sheets

SEMICONDUCTOR DEVICE PROVIDED WITH A CAPACITOR HAVING A HIGH-PERMITTIVITY INSULATOR FILM

BACKGROUND OF THE INVENTION

1. Field of the Invention

The invention relates to a semiconductor device and a method for manufacturing same and, more particularly to, the semiconductor device provided with a capacitor in such a configuration that its capacity insulator film consists of a high-permittivity insulator film and a method for manufacturing the same.

The present application claims priority of Japanese Patent Application No. Hei 11-350894 filed on Dec. 9, 1999, which is hereby incorporated by reference.

2. Description of the Related Art

Large-Scale Integrations (LSIs) known as a representative of semiconductor devices are roughly divided into memory devices and logic devices, the former of which in particular has been developed remarkably by recent improvements in semiconductor manufacturing technologies. The memory devices are further divided into Dynamic Random Access Memories (DRAMs) and Static Random Access Memories (SRAMs), mostly all of which are comprised of Metal Oxide Semiconductor (MOS) transistors excellent in integration density. DRAMs, moreover, can enjoy the above-mentioned advantage of high integration density more than SRAMs, to reduce cost, thus finding a wide range of applications in a variety of memory units used in information equipment or a like.

Since DRAMs utilize each capacitor as an information storing capacitive element to store information based on existence/non-existence of charge held therein, with increasing storage capacity an area occupied by each capacitor becomes restricted which is formed on a semiconductor substrate. Therefore, the capacitors each need to have a larger capacitance. If the capacitance does not have a capacitance enough to hold information, an external noise or a like may cause malfunction readily, thus tending to yield an error represented by a software error.

To increase the above-mentioned capacitance of each capacitor, an insulating material employed as a capacity insulator film needs to have a large permittivity, such as tantalum oxide ($Ta_2O_5$), one of metal oxides widely used as a high-permittivity insulating material. The tantalum oxide film has approximately ten times the permittivity of a silicon oxide ($SiO_2$) film conventionally used as the capacity insulator film and also approximately four times the permittivity (25 to 30) of a silicon nitride ($Si_3N_4$) film conventionally used as well. Therefore, the storage capacity can be increased by making the capacitors using tantalum films as the capacity insulator film.

Also, the capacitor having such a Metal Insulator Metal (MIM)-structure is widely adopted that, along with a tantalum oxide film used as the capacity insulator film, a titanium nitride (TiN) film excellent in step coverage is used to form upper and lower electrodes on opposite vertical surfaces of this capacity insulator film.

FIG. 11 is a cross-sectional view showing a configuration of a prior art semiconductor device having such a MIM-structure capacitor (hereinafter referred simply to as capacitor). As shown in FIG. 11, in an active region surrounded by an element isolating insulator film 52 formed for example on a P-type silicon substrate 51, a gate oxide film 53 and a gate electrode (word line) 54 are formed to thereby locally form an N-type diffused region 55 serving as a source or drain region, a surface of which is covered by an inter-layer insulator film 56 consisting of a silicon oxide film or a like. For simplicity in explanation, the N-type diffused regions 55, which are formed in pair, are illustrated as only one.

The inter-layer insulator film 56 on the N-type diffused region 55 has a contact hole 57 formed therein, which in turn has a capacitor 61 formed therein, which is connected to the N-type diffused region 55. The capacitor 61 comprises a lower electrode 58A consisting of a titanium nitride film, a capacity insulator film 59A consisting of a tantalum oxide film formed thereon, and an upper electrode 60A consisting of a titanium nitride formed thereon.

The following will describe a method for manufacturing the above semiconductor device along the following steps with reference to FIGS. 13A to 13D.

First, as shown in FIG. 13A, on the P-type silicon substrate 51, for example, the element isolating insulator film 52 made of silicon oxide is formed using a known method of LOCal Oxidation of Silicon (LOCOS) or a like and then, in an active region surrounded by this element isolating insulator film 52 are formed a silicon oxide film and a poly-silicon film in this order, which films are subsequently patterned into desired shapes to form the gate oxide film 53 and the gate electrode 54 respectively. Next, using the gate oxide film 53 and the gate electrode 54 as masks in self-alignment, an N-type impurity is introduced to the P-type silicon substrate 51 using a known impurity introducing method such as ion implantation, to locally form the N-type diffused region 55 constituting a source or drain region, following which the inter-layer insulator film 56 made of silicon oxide film or the like is formed throughout thereon using Chemical Vapor Deposition (CVD) or the like.

Next, as shown in FIG. 13B, the contact hole 57 is formed in the inter-layer insulator film 56 on the surface of the N-type diffused region 55 using photolithography and then, by use of CVD or the like, a titanium nitride film 58 which provides a lower electrode film is formed everywhere thereon. Next, as shown in FIG. 13D, using CVD or the like, a tantalum oxide film 59 which provides the capacity insulator film 59A is formed on the titanium nitride 58 in an atmosphere containing oxygen.

Next, In an oxidizing atmosphere consisting of a UV (Ultraviolet)-$O_3$ (ozone atmosphere given by irradiation of ultraviolet light), the silicon substrate 51 is subject to heat treatment at about 500° C. (annealing) to oxidize the tantalum oxide film 59, thereby improving film quality of the tantalum film 59 so that it can serve as the capacity insulator film 59A correctly. That is, the tantalum oxide film 59 has a problem in terms of a leakage characteristic if it is used as the capacity insulator film 59A, so that it must be oxidized to enhance its insulation performance, thus suppressing a leakage current.

Specifically, if, for example, this tantalum oxide film 59 is not sufficiently oxidized (that is, $x \leq 4$ for $Ta_2O_x$), it is to be further oxidized to a sufficient level to improve its quality, thus providing a stable film (that is, $Ta_2O_5$).

Next, as shown in FIG. 13D, on the tantalum film 59, a titanium nitride film 60 is formed which provides an upper electrode film 60A, using CVD or the like. Next, the titanium nitride film 58, the tantalum oxide film 59, and the titanium nitride film 60 are patterned using photolithography to form the upper electrode 60A, thus completing a semiconductor device having the capacitor 61 as shown in FIG. 11.

By the prior-art semiconductor device manufacturing method, however, the titanium nitride film 58 which provides the lower electrode 58A is readily oxidized and, in fact, is oxidized during the above-mentioned heat treatment of the silicon substrate in an oxidizing atmosphere, so that as shown in FIG. 12, a titanium oxide ($TiO_2$) film 58B is formed on the surface of the lower electrode 58A consisting of the titanium nitride film 58. With this, this titanium oxide film 58B problematically acts as a low-permittivity film. If the titanium oxide film 58B having a low permittivity is thus formed on an interface of the lower electrode 58A and the capacity insulator film 59A, this titanium oxide film 58B is connected in series with the capacity insulator film 59A to act as part of that capacity insulator film 59A, so that total capacitance of the capacitor 61 decreases because it is affected by the low-permittivity film. Therefore, even if a tantalum oxide film which provides a high-permittivity film is employed, it is difficult to increase the capacitance of the relevant capacitor 61.

Permittivity of titanium oxide films is discussed in, for example, Japan Journal of Applied Physics (Vol. 38 (1999), pp. 6034–6038). This paper illustrates a relationship, as shown in FIG. 14, of the heat treatment temperature (horizontal axis) and the permittivity (vertical axis), which indicates that the permittivity of a titanium oxide film will change with the temperature of heat treatment. As an example, it indicates that the permittivity will be about 22 for heat treatment at about 600° C. and decrease for heat treatment at lower temperatures.

By the above-mentioned heat treatment, the titanium oxide film 58B formed on the surface of the titanium nitride film 58 constituting the lower electrode 58A has a permittivity of about 15 or less, which is considerably lower than that of the tantalum oxide film 59 (25 to 30 as mentioned above).

The titanium oxide film 58B constituting a low-permittivity film, on the other hand, acts to decrease the total capacitance of the capacitor 61 but, as an advantage, serves as a leakage-current stopper film for suppressing leakage current of the capacitor 61. Therefore, if the titanium oxide film 58B is not formed at all, the leakage current tends to increase. In this case, however, the titanium oxide film 58B acts as part of the capacity insulator film 59A, so that the capacitance of the capacitor 61 decreases as its film thickness increases too much.

Note here that there is observed a difference in leakage-current characteristic of a completed capacitor between a case where the above-mentioned $UV-O_3$ oxidation is performed at a relatively high temperature, that is, strong oxidation, and a case where it is performed at a relatively low temperature, that is, weak oxidation. FIG. 15 shows an example of the capacitor leakage-current characteristic, that is, a relationship of an application voltage (horizontal axis) and a leakage current (vertical axis), of a capacitor which has undergone strong oxidation, in processing, at about 500° C. for about ten minutes and completed. FIG. 16, on the other hand, shows an example of the leakage-current characteristic of a capacitor which has undergone weak oxidation at about 400° C. for about ten minutes and completed.

As apparent from comparison of FIGS. 15 and 16, the characteristic shown in FIG. 15 of the capacitor completed by strong oxidation indicates that a larger thickness is obtained of the titanium oxide film formed on the surface of the lower electrode and so the leakage current is reduced but, at the same time, its film thickness calculated as silicon oxide film, teq, has a relatively large value of about 3.2 nm, thus reducing the capacitance.

The characteristic shown in FIG. 16 of the capacitor completed by weak oxidation, on the other hand, indicates that the titanium oxide film formed on the surface of the lower electrode has a smaller film thickness and so has a larger capacitance but, at the same time, its film thickness calculated as silicon oxide film, teq, has a relatively small value of 2.5 nm, thus increasing the leakage current.

Note here that the film thickness, teq, calculated as silicon oxide film represents a film thickness calculated as being equivalent to the thickness of a silicon oxide film required to obtain a predetermined capacitance, indicating that the smaller the thickness, the better the performance.

Thus, although a low-permittivity film must be present which consists of the titanium oxide film 58B formed on the surface of the lower electrode 58A of the capacitor 61 when heat treatment is being performed for improving the quality of the tantalum oxide film 59 used as a capacity insulator film 59A, film thickness of this low-permittivity film provides a negative correlation between capacitance and leakage current of the capacitor 61 Japanese Patent Application Laid-open No. Hei 7-14992, for example, discloses a semiconductor device and a method for manufacturing a same for preventing a low-permittivity film from being formed on an interface of a lower electrode and a capacity insulator film and thereby implementing a capacitor having a large capacitance and a small leakage current. This semiconductor device comprises, as shown in FIG. 17, a capacitor 70 which includes a lower electrode 72 which has a thickness of about 100 nm and consists of a Ta (tantalum) film formed on a silicon substrate 71, a first capacity insulator film 73 which has a thickness of about 5 nm and consists of a tantalum oxide film formed on the lower electrode 72, a second capacity insulator film 74 which has a thickness of about 25 nm and consists of a titanium oxide formed on the first capacity insulator film 73, and an upper electrode 75 which has a thickness of about 100 nm and consists of a titanium nitride film formed on the second capacity insulator film 74. It is supposed that in this configuration of the capacitor 70, by constituting the capacity insulator film using the first capacity insulator film 73 (which is described to have a permittivity of 20 or larger) consisting of a tantalum oxide film and the second capacity insulator film 74 (which is described to have a permittivity of 100 or larger) consisting of a titanium oxide film, a low-permittivity film is prevented from being formed at an interface of the lower electrode 72 and the second capacity insulator film 74 and, at a same time, there is formed the first capacity insulator film 73 having a high permittivity, thus making implementing such the capacitor 70 that has a large capacitance with a reduced leakage current.

The following will describe a method for manufacturing the same semiconductor device with reference to FIGS. 18A and 18B. First, as shown in FIG. 18A, a tantalum film 72A and a titanium film 74A are formed on the silicon substrate 71 in this order by using a sputtering method. Next, as shown in FIG. 18B, the titanium film 74A is completely oxidized by plasma oxidation, to form a titanium oxide film 74B and, at the same time, the tantalum film 72A is oxidized only on its surface to form a tantalum oxide film 72B. Next, a titanium nitride film (not shown) is formed on the titanium oxide film 74B to subsequently pattern this titanium nitride film into a desired shape using an ordinary photolithography technique so as to form the upper electrode 75, thus completing the capacitor 70 shown in FIG. 17.

The prior art semiconductor device and method for manufacturing the same disclosed in the above publication, however, have a problem that a large capacitance cannot be obtained because a relevant titanium oxide film used as a capacity insulator film is difficult to act as a high-permittivity film.

That is, although the above publication says that a permittivity of 100 or larger can be given to the titanium oxide film 74B used as the second capacity insulator film 74 constituting the capacitor 70 such as shown in FIG. 17, the permittivity of the titanium oxide film 74B changes with temperature of heat treatment as shown in FIG. 14, so that it is difficult, as described in the above publication, to form a high-permittivity film by plasma oxidation.

Rather, it is much possible for the titanium oxide film formed by plasma oxidation to fluctuate in permittivity so that such a film having a low permittivity of about 15 or lower may be formed as the titanium oxide film 58B obtained by oxidizing the surface of the lower electrode 58A, as described with FIG. 12. Thus, if the permittivity of the capacity insulator film which determines the capacitance of the capacitor is liable to fluctuate, it is difficult to acquire a capacitance necessary for the capacitor to operate normally.

SUMMARY OF THE INVENTION

In view of the above, it is an object of the invention to provide a semiconductor device and a method for manufacturing same for suppressing a leakage current while securing a capacitance necessary for its capacitor to operate normally.

According to a first aspect of the present, there is provided a semiconductor device provided with a capacitor which is so formed as to be connected to one diffused region on a semiconductor substrate, the capacitor including:

a lower electrode consisting of a metal film which is so formed as to be connected to the diffused region;

a first capacity insulator film consisting of a high-permittivity insulator film formed on the lower electrode;

a second capacity insulator film which consists of a oxide film made of component metal of the lower electrode formed on an interface of the first capacity insulator film and the lower electrode, which has a lower permittivity than the first capacity insulator film, and which has a predetermined film thickness; and an upper electrode consisting of a metal film formed on the first capacity insulator film.

Also, according to a second aspect of the present, there is provided a semiconductor device provided with a capacitor which is so formed as to be connected to one diffused region on a semiconductor substrate, the capacitor including:

a lower electrode consisting of a metal film which is so formed as to be connected to the diffused region;

a first capacity insulator film consisting of a high-permittivity insulator film formed on the lower electrode;

a second capacity insulator film which consists of a metal oxide film formed on the first capacity insulator film, which has a lower permittivity than the first capacity insulator film, and which has a predetermined film thickness; and a metal film formed on the second capacity insulator film.

In the foregoing first or second aspect, a preferable mode is one wherein the lower electrode is connected through a capacity contact to the diffused region.

Also, a preferable mode is one wherein the lower electrode or the upper electrode is made of titanium nitride, titanium, tungsten nitride, or tungsten.

Furthermore, a preferable mode is one wherein the first capacity insulator film is made of tantalum oxide.

Still furthermore, a preferable mode is one wherein the second capacity insulator film is made of titanium oxide and has a film thickness of 0.2 to 1.0 nm.

Also, According to a third aspect, there is provided a method for manufacturing a semiconductor provided with a capacitor so formed as to be connected to one diffused region on a semiconductor substrate, including the steps of:

locally forming, as a diffused-region forming step, a second-conductivity type diffused region on a first-conductivity type semiconductor substrate;

forming, as a lower-electrode forming step, a lower electrode consisting of a metal film constituting the capacitor in such a manner that the lower electrode may be connected to the one diffused region;

sequentially forming, as a capacity insulator film forming step, a first capacity insulator film consisting of a high-permittivity insulator film constituting the capacitor on the lower electrode in a plurality of sub-steps;

performing heat treatment, as a semiconductor-substrate heat treating step, on the semiconductor substrate in an oxidizing atmosphere for each of the plurality of sub-steps of the capacity insulator film forming step, to thereby form a second capacity insulator film consisting of an oxide film made of component metal of the lower electrode on an interface of the first capacity insulator film and the lower electrode; and forming, as an upper-electrode forming step, an upper electrode consisting of a metal film constituting the capacitor on the first capacity insulator film.

Furthermore, according to a fourth aspect of the present invention, there is provided a method for manufacturing a semiconductor device provided with a capacitor so formed as to be connected to one diffused region on a semiconductor substrate, including the steps of:

locally forming, as a diffused-region forming step, a second conductivity-type diffused region on a first conductivity-type semiconductor substrate;

forming, as a lower-electrode forming step, a lower electrode consisting of a metal film constituting the capacitor in such a manner that the lower electrode may be connected to the one diffused region;

forming, as a capacity insulator film forming step, a first capacity insulator film consisting of a high-permittivity insulator film constituting the capacitor on the lower electrode;

forming, as a metal film forming step, a metal film capable of forming a metal film on the first capacity insulator film;

performing heat treatment, as a semiconductor-substrate heat treating step, on the semiconductor substrate in an oxidizing atmosphere to oxidize the metal film, thus forming a second capacity insulator film consisting of a metal oxide film to a predetermined film thickness; and forming, as an upper-electrode forming step, an upper electrode consisting of a metal film constituting the capacitor on the first capacity insulator film.

In the foregoing third or fourth aspect, a preferable is one that wherein further including a step of forming, a capacity contact forming step, a capacity contact in such a manner that the capacity contact may be connected to the diffused region, between the diffused-region forming step and the lower-electrode forming step.

Also, a preferable mode is one wherein as a material of the lower electrode or the upper electrode, titanium nitride, titanium, tungsten nitride, or tungsten is employed.

Also, a preferable mode is one wherein as a material of the first capacity insulator film, tantalum oxide is employed.

Furthermore, a preferable mode is one wherein as the second capacity insulator film, a titanium oxide film having a film thickness of 0.2 to 1.0 nm is formed.

With the above configurations, it become possible to reduce the leakage current while suppressing a decrease in capacitance of the capacitor with a reduced film thickness calculated as silicon oxide film. That is, the leakage current can be suppressed while securing a capacitance large enough to permit the capacitor to operate normally.

Also, it become possible to manufacture the capacitor easily without requiring any special steps.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
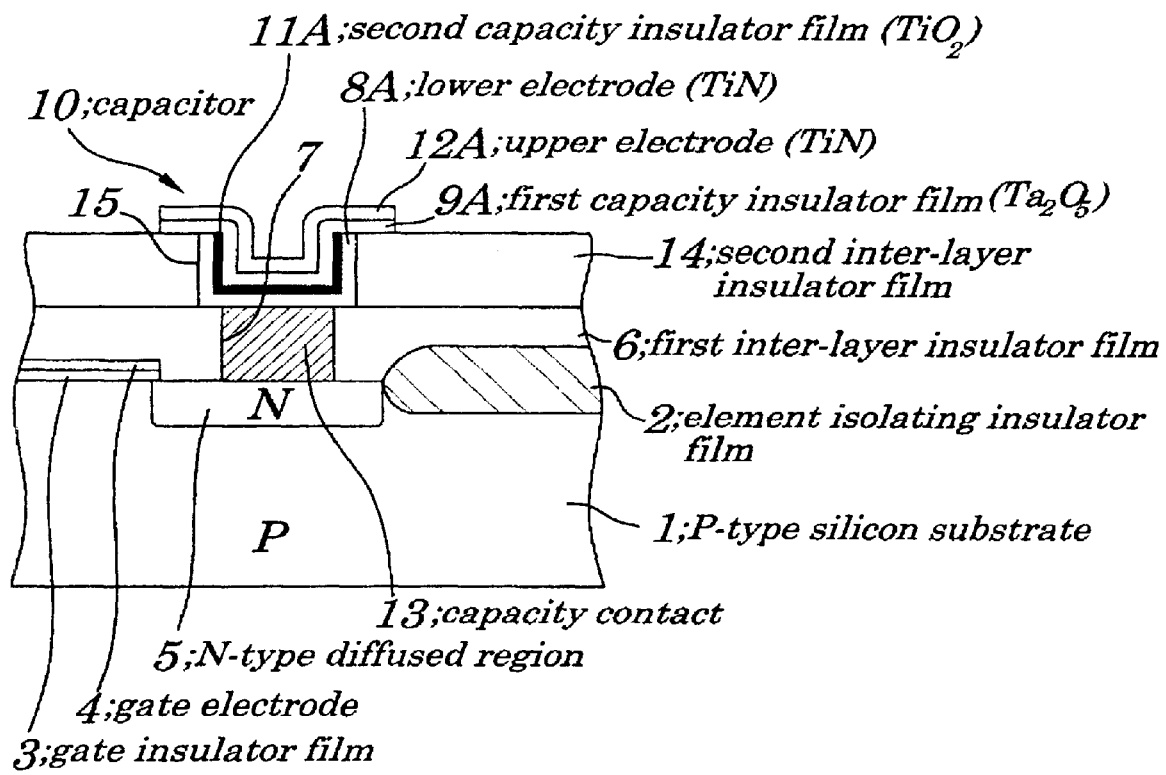
FIG. 1 is a cross-sectional view showing a configuration of a semiconductor device according to a first embodiment of the present invention.

In a semiconductor device according to this embodiment, as shown in FIG. 1, in an active region surrounded by an element isolating insulator film 2 formed for example on a P-type silicon substrate 1, a gate insulator film 3 and a gate electrode (word line) 4 are formed to thereby locally form an N-type diffused region 5 constituting a source or drain region, a surface of which is covered by a first inter-layer insulator film 6 consisting of a silicon oxide film or a like. For simplicity in explanation, the N-type diffusion regions 5, which are formed in pair, are shown as only one.

In the first inter-layer insulator film 6 formed on the surface of the N-type diffused region 5 is formed a first contact hole 7, in which is in turn formed a capacity contact 13. The capacity contact 13 comprises a poly-silicon film, a tungsten film, a titanium nitride film, or a like, for connecting the N-type diffused region 5 and a capacitor 10 with each other. The first inter-layer insulator film 6 is covered by a second inter-layer insulator film 14 consisting of a silicon oxide film or a like, in which the second inter-layer insulator film 14 is formed a second contact hole 15, in which is in turn formed the capacitor 10.

This capacitor 10 comprises a lower electrode 8A consisting of a titanium nitride film, a first capacity insulator film 9A consisting of a tantalum oxide film formed on the lower electrode 8A, a second capacity insulator film 11A with a film thickness of 0.2 to 1.0 nm consisting of a titanium oxide film formed at an interface of the first capacity insulator film 9A and the lower electrode 8A, and an upper electrode 12A consisting of a titanium oxide film formed on the first capacity insulator film 9A in such a configuration that the lower electrode 8A is connected via a capacity contact to the N-type diffused region 5.

As mentioned above, the capacitor 10 is connected to the N-type diffused region 5 through the capacity contact 13 so that it may thus be connected to the N-type diffused region 5 in a good connecting condition even when the first contact hole 7 formed in the first inter-layer insulator film 6 has a large aspect ratio.

The above-mentioned value of the film thickness, 0.2 to 1.0 nm, of the second capacity insulator film 11A consisting of a titanium oxide film provides a condition for improving leakage characteristic without decreasing capacitance of the capacitor 10. That is, if the film thickness of the second capacity insulator film 11A is less than 0.2 nm, the capacitor 10 has a larger capacitance but, undesirably, its leakage current exceeds an allowable value. If that film thickness is larger than 1 nm, on the other hand, the leakage current characteristic is improved but, undesirably, the capacitor 10 has a smaller capacitance. The following will describe the reason why the thickness value of the second capacity insulator film 11A consisting of a titanium oxide film has been set in the above-mentioned range.

Figure 2:
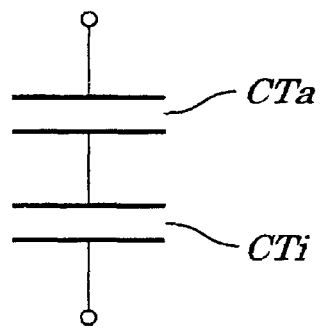
FIG. 2 is an illustration showing an equivalent circuit of a capacitor of the semiconductor device of FIG. 1.

(1) Setting upper limit of film thickness:

As shown in FIG. 2, an equivalent circuit of the capacitor 10 according to this embodiment consists of a series connection of a capacitance CTa of the first capacity insulator film 9A consisting of a tantalum oxide film and a capacitance CTi of the second capacity insulator film 11A consisting of a titanium oxide film. These capacitances CTa and CTi are given as follows:

$$CTa = \epsilon 0 \cdot \epsilon Ta \epsilon S/dTa \quad \text{Equation (1)}$$

$$Ti = \epsilon 0 \cdot \epsilon Ti \cdot S/dTi \quad \text{Equation (2)}$$

Where $\epsilon 0$: permittivity of vacuum $\epsilon Ta$: permittivity of tantalum oxide film dTa: film thickness of tantalum oxide film $\epsilon Ti$: permittivity of titanium oxide film dTi: film thickness of titanium oxide film S: area of electrode With this, a total capacitance CTo of the capacitance CTa of the above-mentioned first capacity insulator film 9A and the capacitance CTi of the second capacity insulator film 11A is given on the basis of the Equations (1) and (2) as follows:

$$1/CTo = (1/CTa) + 1/CTi \quad \text{Equation (3)}$$
$$= (dTa/\varepsilon\, 0 \cdot \varepsilon\, Ta \cdot S) + (dTi/\varepsilon\, 0 \cdot \varepsilon\, Ti \cdot S)$$
$$= (1/\varepsilon\, 0 \cdot S((dTA/\varepsilon\, Ta) + (dTi/\varepsilon\, Ti))$$

The total capacitance CTo, therefore, Is given on the basis of Equation (3) as follows:

$$CTo = \epsilon 0 \cdot S(1/(dTa/\epsilon Ta) + (dTi/\epsilon Ti)) \quad \text{Equation (4)}$$

As apparent from Equation (4), the total capacitance CTo becomes smaller as the value of (dTi/$\epsilon$Ti) becomes larger.

Now, based on Equation (4) above, the total capacitance CTo is obtained as follows respectively in a case where the titanium oxide film which provides the second capacity insulator film 11A is not formed at all on the surface of the lower electrode 8A consisting of a titanium nitride film (that is, dTi=0) and a case where this titanium oxide film is formed to an ordinary thickness (for example, dTi=1 nm):

When dTi=0, total capacitance CTo≈3.125$\epsilon$0·S

When dTi=1 nm, total capacitance CTo≈2.586$\epsilon$0·S where in both cases, $\epsilon$Ta=25 and $\epsilon$Ti=15 are set.

As apparent from comparison of these two values, therefore, the total capacitance CTo of the latter is reduced to about 82% of that of the former, indicating that the total capacitance CTo becomes smaller with the increasing film thickness of the titanium oxide film which provides the second capacity insulator film 11A formed on the surface of the lower electrode 8A.

Figure 3:
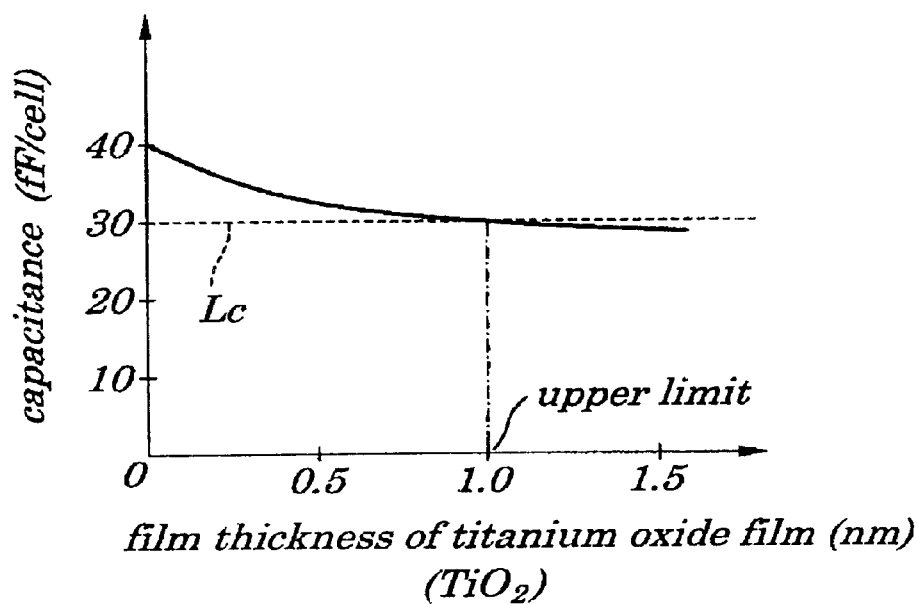
FIG. 3 is a graph showing a relationship between film thickness (horizontal axis) and a capacitance (vertical axis) of a titanium oxide film constituting part of a capacity insulator film of the capacitor of the semiconductor device of FIG. 1.

As can be seen in FIG. 3, there is a relationship that capacitance decreases with increasing film thickness of the titanium oxide film.

With this, in the case where a DRAM capacitor is formed actually, in order to permit the DRAM capacitor to operate normally, it is supposed to be necessary to secure a capacitance of about 30 fF (femto Farad)/cell, thus establishing an allowable line Lc as shown in FIG. 3. Therefore, to meet this condition, the film thickness of the titanium oxide film must be about 1 nm or larger, which value is set as an upper limit of the film thickness of the titanium oxide film.

Figure 4:
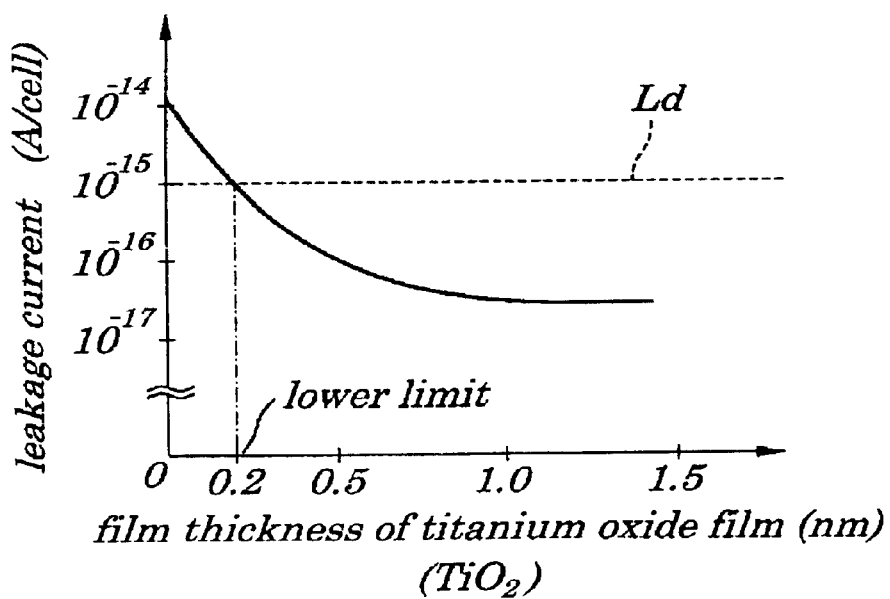
FIG. 4 is a graph showing a relationship between a film thickness (horizontal axis) and a leakage current (vertical axis) of the film thickness of the titanium oxide film constituting part of the capacity insulator film of the capacitor of the semiconductor device of FIG. 1.

(2) Setting lower limit of film thickness:

As can be seen in FIG. 4, there is a relationship in that leakage current decreases with increasing film thickness of the titanium oxide.

In the case where the DRAM capacitor is formed actually, in order to permit the DRAM capacitor to operate normally, its leakage current must be suppressed to about $10^{-15}$ A (Ampere)/cell or lower, based on which an allowable line Ld is set as shown in FIG. 4. To meet this condition, therefore, the titanium oxide film must have a film thickness of about 0.2 nm or larger, which value is set as a lower limit of the film thickness of the titanium oxide film.

Thus, the upper limit of the film thickness of the second capacity insulator film 11A formed on the surface of the lower electrode 8A consisting of a titanium nitride film is set at about 1 nm from a viewpoint of necessity of securing a capacitance large enough for the capacitor 10 to operate normally. The lower limit of the film thickness of that second capacity insulator film 11A, on the other hand, is set at about 0.2 nm from a viewpoint of necessity of suppressing its leakage current to a value small enough for the capacitor 10 to operate normally.

Figure 5:
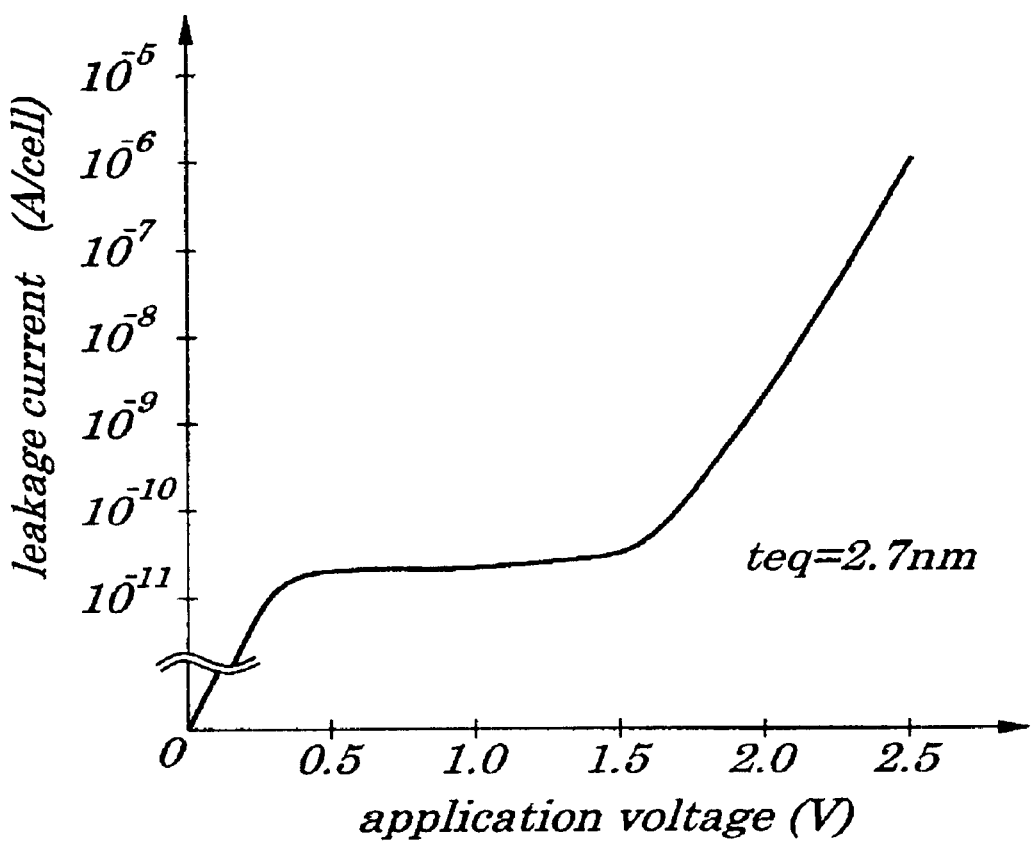
FIG. 5 is a graph showing a relationship between an application voltage (horizontal axis) and a leakage current (vertical axis) of the capacitor of the semiconductor device of FIG. 1.
Figure 15:
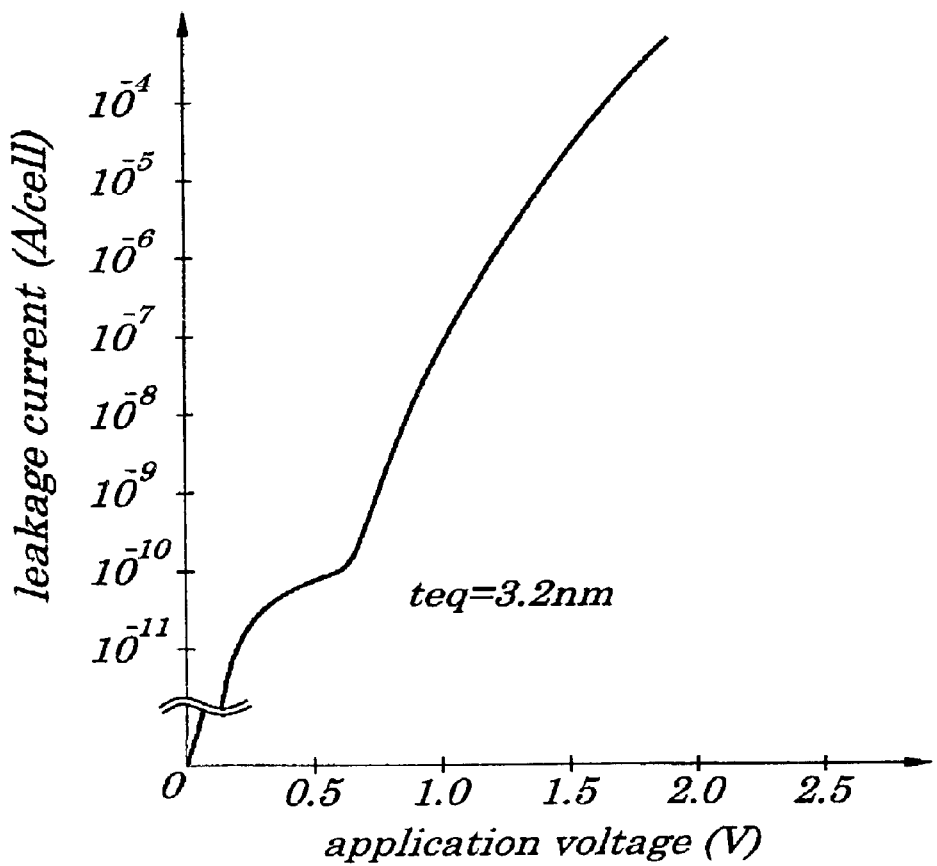
FIG. 15 is a graph showing a relationship between an application voltage (horizontal axis) and a leakage current (vertical axis) of the capacitor of the semiconductor device of FIG. 11 after strong heat treatment.
Figure 16:
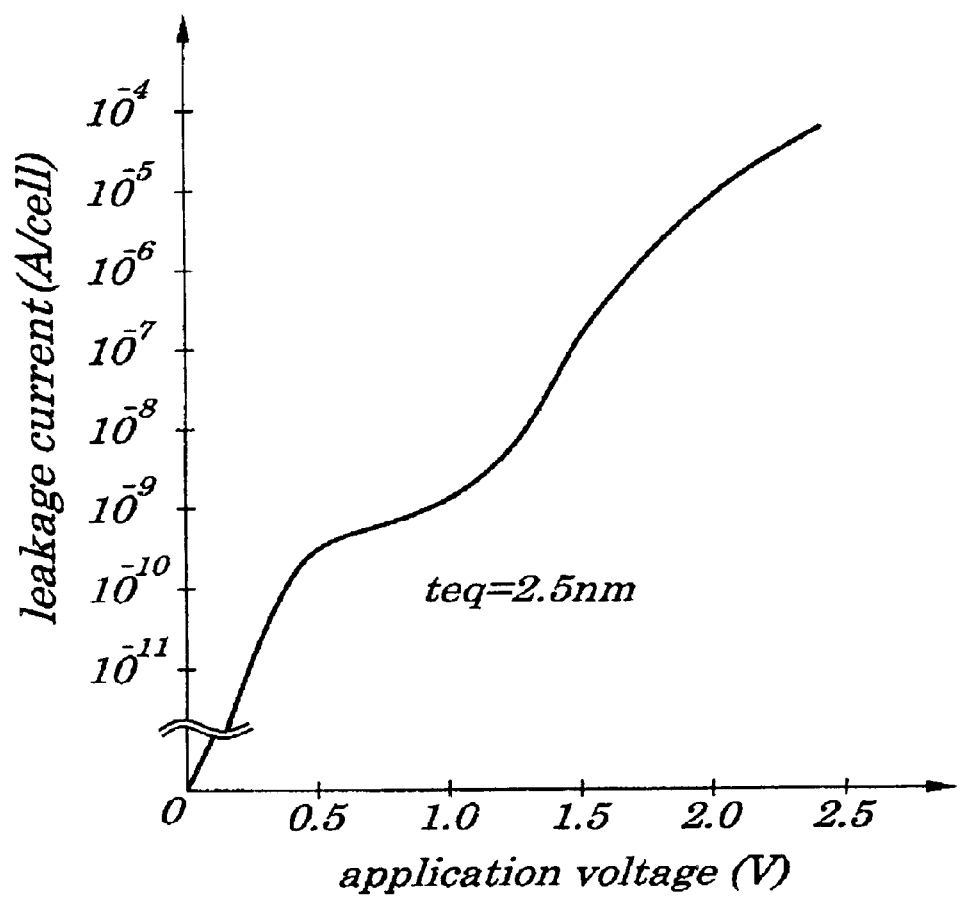
FIG. 16 is a graph showing a relationship between an application voltage (horizontal axis) and a leakage current (vertical axis) of the capacitor of the semiconductor device of FIG. 11 after weak heat treatment.
Figure 17:
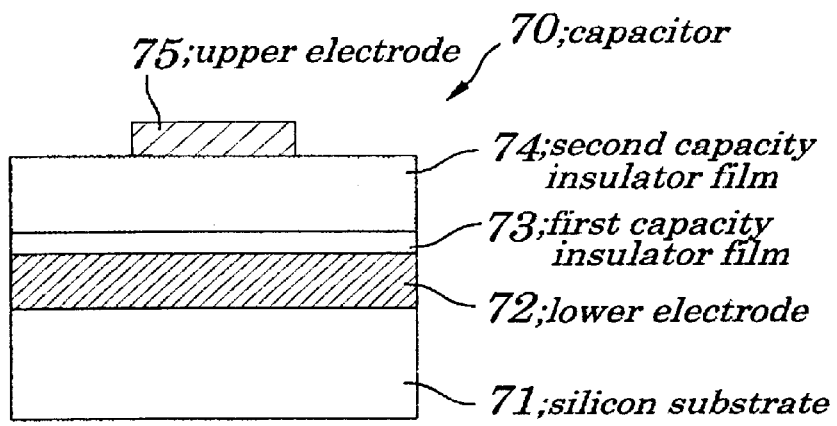
FIG. 17 is a cross-sectional view showing a configuration of the prior art semiconductor device.
Figure 18A:
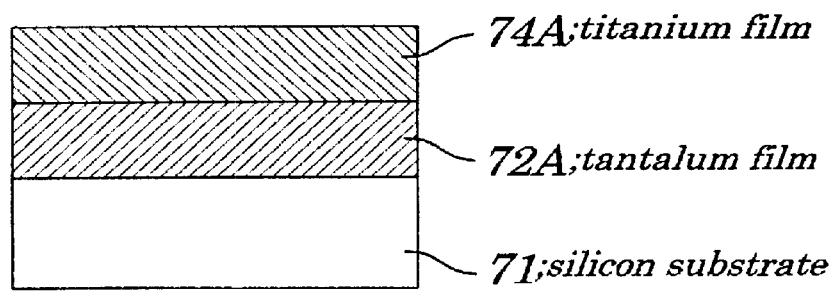
FIGS. 18A and 18B are flow diagrams showing a method for manufacturing another . . . prior art semiconductor device of FIG. 17.
Figure 18B:
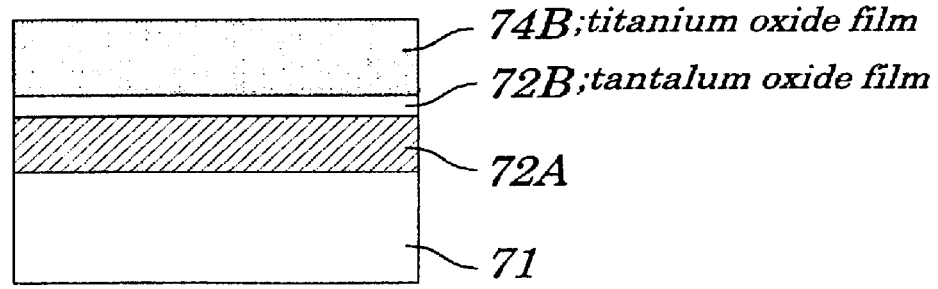

FIG. 5 shows a leakage-current characteristic of the capacitor 10 of the semiconductor according to this embodiment, in which a relationship is indicated between an application voltage (horizontal axis) and a leakage current (vertical axis). The characteristics shown in FIG. 5 indicate that, as mentioned above, by setting at 0.2 to 1.0 nm the film thickness of the second capacity insulator film 11A formed on the surface of the lower electrode 8A consisting of a titanium nitride film, it is possible to reduce the leakage current while suppressing a decrease in capacitance of the capacitor 10 as much as possible with a value of about 2.7 nm of the film thickness, teq, calculated as silicon oxide film which is smaller than that of the prior art example shown in FIGS. 15 and 16.

The following will describe a method for manufacturing the semiconductor device with reference to FIGS. 6A through 6H.

Figure 6A:
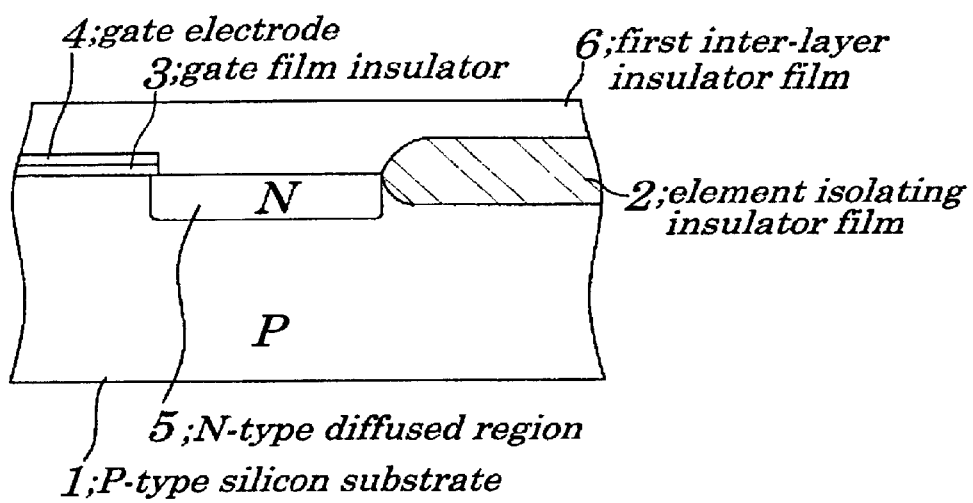
FIGS. 6A and 6B are flow diagrams showing a method for manufacturing the semiconductor device of FIG. 1 along its steps.

First, as shown in FIG. 6A, on the P-type silicon substrate 1, for example, the element-isolating insulator film 2 consisting of a silicon oxide film is formed using a known LOCOS technique or a like and, subsequently, in an active region surrounded by the element-isolating insulator film 2 are formed a silicon oxide film and a poly-silicon film in this order, which are then patterned into their respective desired shapes to form the gate insulator film 3 and the gate electrode 4 respectively. Next, using these gate insulator film 3 and the gate electrode 4 as masks in self-alignment, an N-type impurity is introduced to the P-type silicon substrate 1 using a known impurity-introducing technique such as ion implantation, to locally form the N-type diffused region 5 constituting a source or drain region, in order to subsequently form the first inter-layer insulator film 6 consisting of a silicon oxide or a like throughout thereon by CVD or a like.

Figure 6B:
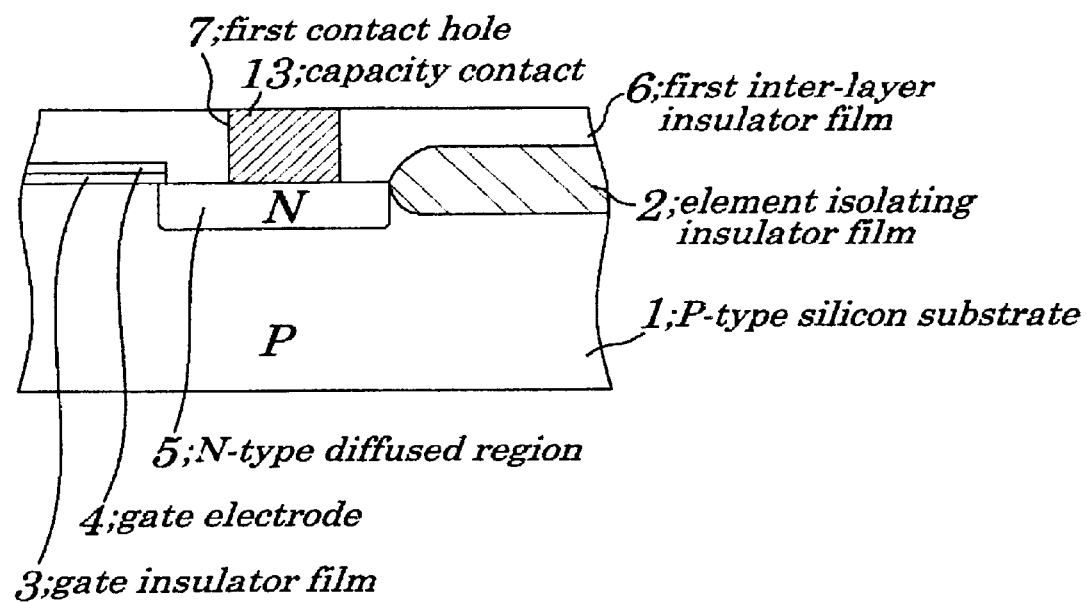

Next, as shown in FIG. 6B, the first inter-layer insulator film 6 is patterned by photography to form the first contact hole 7 through which the surface of the N-type diffused region 5 is exposed and then, by CVD or the like, a conductive film is formed throughout thereon which includes a poly-silicon film which provides a capacity contact film, a tungsten film, a titanium nitride film, or a like film.

Next, unnecessary parts of the conductive film formed on the first inter-layer insulator film 6 are removed by an etch-back technique, to form the capacity contact 13 as buried in the first contact hole 7.

Figure 6C:
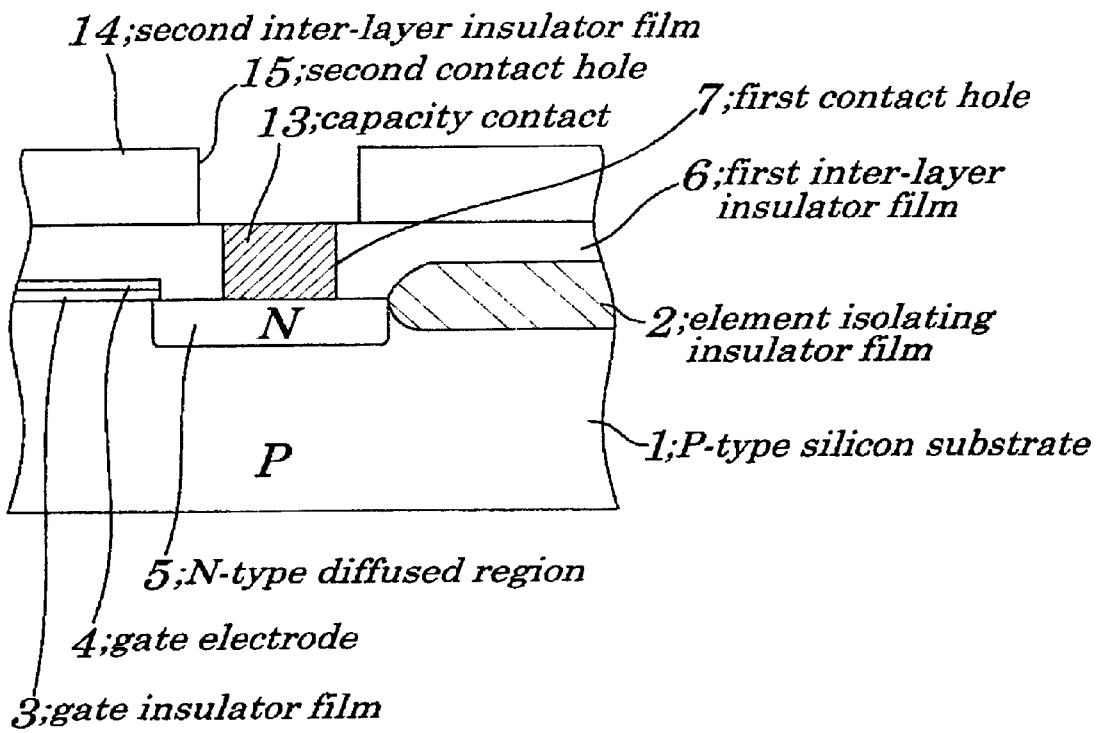
FIGS. 6C and 6D are continued flow diagrams showing the method for manufacturing the semiconductor device of FIG. 1 along its steps.

Next, as shown in FIG. 6C, the second inter-layer insulator film 14 consisting of a silicon oxide film or a like is formed throughout on the surface by CVD or the like and then, by photolithography, the second inter-layer insulator film 14 is patterned to form the second contact hole 15 through which the surface of the capacity contact 13 is exposed.

Figure 6D:
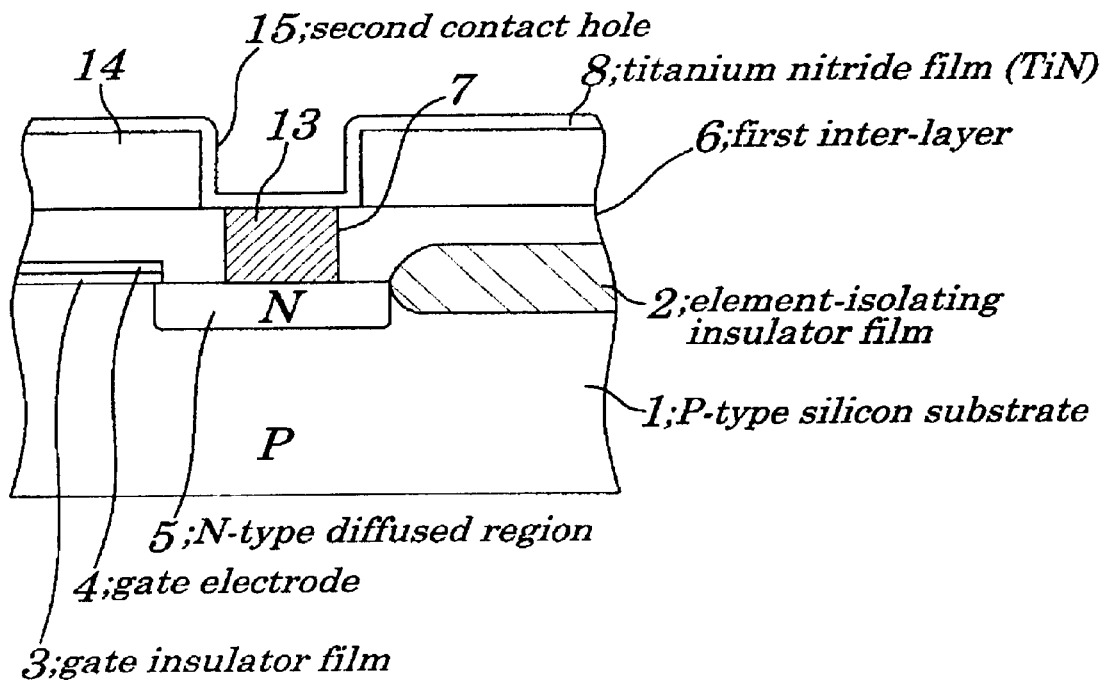

Next, as shown in FIG. 6D, a titanium nitride film 8 which provides the lower electrode 8A is formed to a thickness of 10 to 50 nm throughout on the surface using CVD or the like. Next, unnecessary parts of the titanium nitride film 8 formed on the second inter-layer insulator film 14 are removed by the etch-back technique.

Figure 6E:
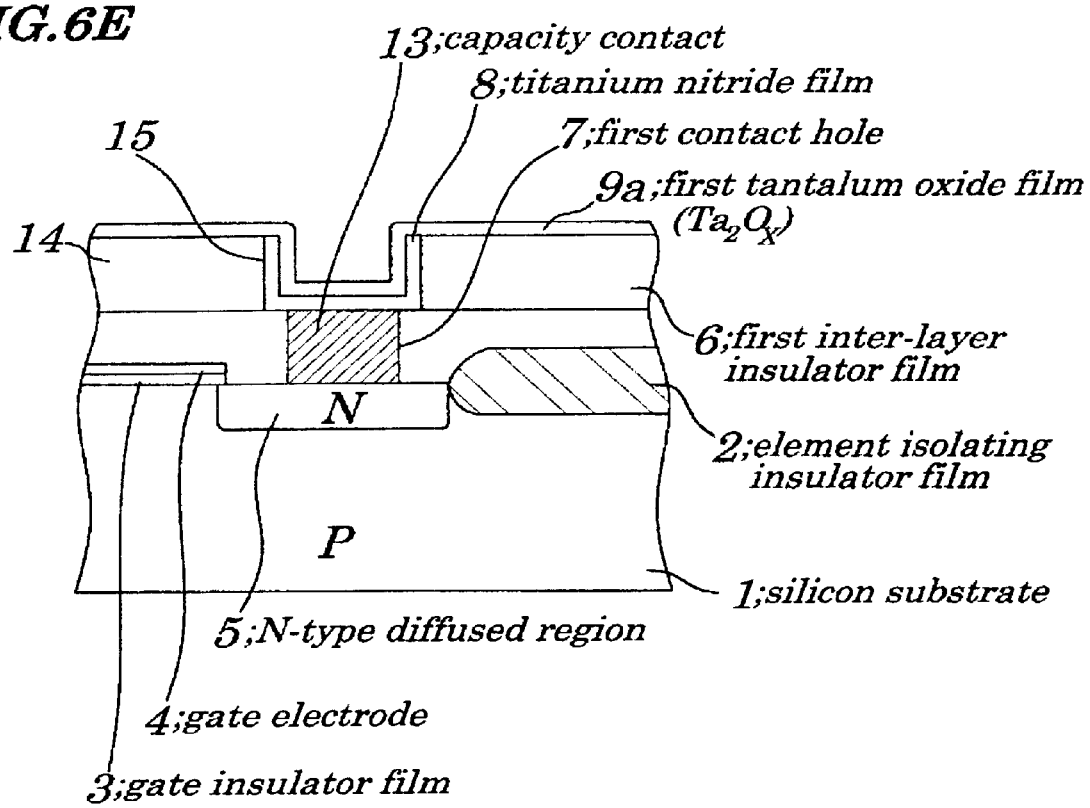
FIGS. 6E and 6F are further continued flow diagrams showing the method for manufacturing the semiconductor device of FIG. 1 along its steps.

Next, as shown in FIG. 6E, the P-type silicon substrate 1 is put in a CVD apparatus, in which first tantalum oxide film 9a which provides the first capacity insulator film 9A is formed to a thickness of about 4 nm throughout on the surface under conditions that a tantalum penta-ethoxide gas is supplied as a source gas at a temperature of about 430° C. and a pressure of about 53 Pa (about 0.4 Torr). Often, this first tantalum oxide film 9a is not sufficiently oxidized (that is, $x \leq 4$ for $Ta_2O_x$) and so needs to be subsequently oxidized sufficiently and modified into a stable film ($Ta_2O_5$).

Figure 6F:
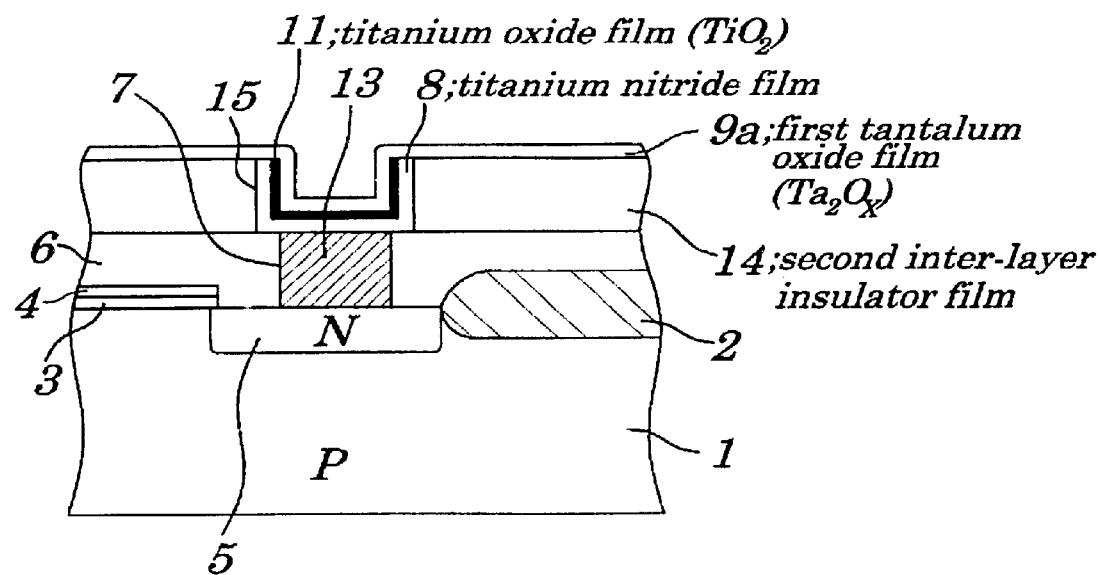

Next, as shown in FIG. 6F, the P-type silicon substrate 1 undergoes heat treatment at about 400° C. in an oxidizing UV-$O_3$ atmosphere for about five minutes. By this heat treatment, which is so-called "weak oxidation", the above-mentioned first tantalum oxide film 9a not sufficiently oxidized is oxidized sufficiently and modified into a stable film. Also, during this oxidation, a titanium oxide film 11 is formed to a thickness of 0.2 to 1.0 nm on an interface of the titanium nitride film 8 and the first tantalum oxide film 9a. The titanium oxide film 11 serves as the second capacity insulator film 11A.

Figure 6G:
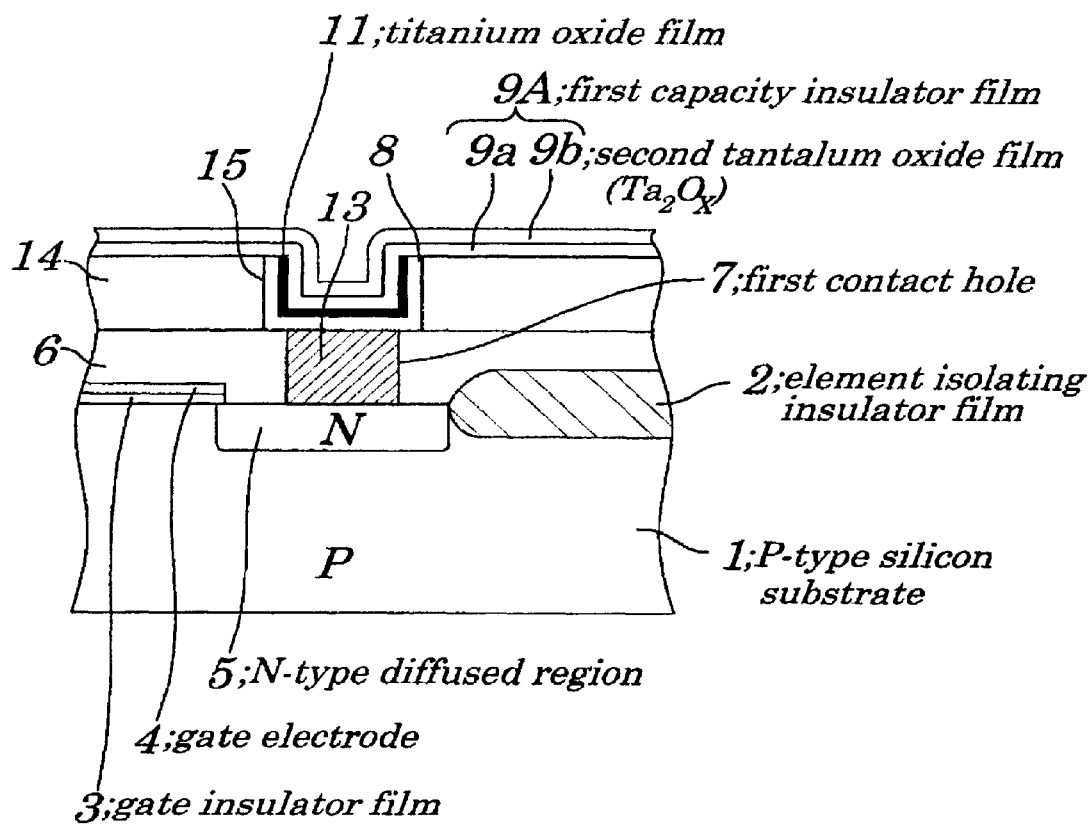
FIGS. 6G and 6H are still further continued flow diagrams showing the method for manufacturing the semiconductor device of FIG. 1 along its steps.

Next, as shown in FIG. 6G, under almost same conditions as those with FIG. 6E, on the first tantalum oxide film 9a, a second tantalum oxide film 9b is formed to a film thickness of about 4 nm by CVD or the like to provide the first capacity insulator film 9A. Like the first tantalum oxide film 9a, the second tantalum oxide film 9b also is not sufficiently oxidized in many cases and so needs to be subsequently oxidized sufficiently and modified into a stable film.

Next, heat treatment is performed under almost same conditions as those with FIG. 6F, to sufficiently oxidize the above-mentioned second tantalum oxide film 9b not yet oxidized sufficiently. Like in a case of the above-mentioned case, this heat treatment is also weak treatment, so that the titanium oxide film 11 already formed is oxidized little in film thickness. Therefore, the film thickness of the titanium oxide film 11 is maintained at about 0.2 to 1.0 nm. The second tantalum oxide film 9b is stacked on the existing first tantalum oxide film 9a, to serve together as the first capacity insulator film 9A.

Figure 6H:
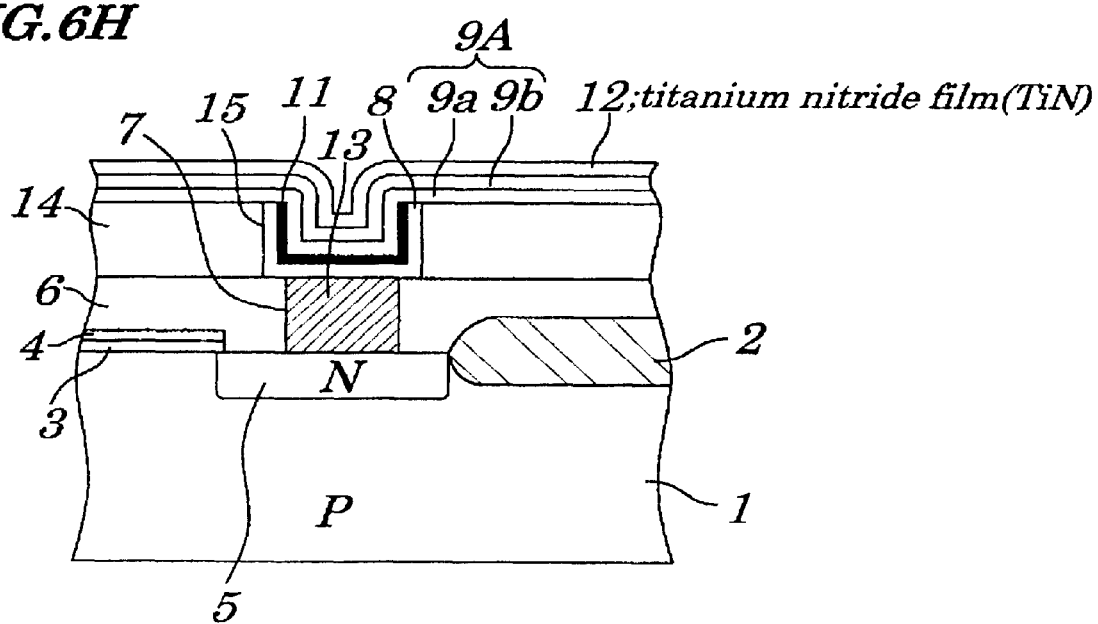

Next, as shown in FIG. 6H, a titanium nitride film 12 is formed on the second tantalum oxide film 9b by CVD or the like. Next, the first tantalum oxide film 9a, the second tantalum oxide film 9b, and the titanium nitride film 12 are patterned by photolithography to form the upper electrode 12A, thus completing a semiconductor device having such a capacitor 10 as shown in FIG. 1.

Thus, by the semiconductor device according to this embodiment, the capacitor 10 is comprised of the lower electrode 8A consisting of a titanium nitride film, the first capacity insulator film 9A consisting of a tantalum oxide film formed on the lower electrode 8A, the second capacity insulator film 11A consisting of a titanium nitride film formed to a thickness of 0.2 to 1.0 nm onto an interface of the first capacity insulator film 9A and the lower electrode 8A, and the upper electrode 12A consisting of a titanium nitride film formed on the first capacity insulator film 9A, thus making it possible to reduce the leakage current while suppressing a decrease in the capacitance of the capacitor 10 with a small film thickness calculated as silicon oxide film.

Also, by the method for manufacturing the semiconductor device according to this embodiment, after the titanium nitride film 8 is formed to provide the lower electrode 8A, the first tantalum oxide film 9a which provides the first capacity insulator film 9A and the second tantalum oxide film 9b are formed in this order, to perform oxidation after each of the first and second tantalum oxide films 9a and 9b is formed, to form the second capacity insulator film 11A consisting of a titanium oxide film to a thickness of 0.2 to 1.0 nm on the interface of the first capacity insulator film 9A and the lower electrode 8A, thus making it possible to manufacture the capacitor 10 easily with no special extra steps required.

With this, the leakage current can be suppressed while securing a capacitance large enough for the capacitor to operate normally.

Second Embodiment

A semiconductor device according to a second embodiment differs largely in configuration from that according to the above-mentioned first embodiment in a respect that it has a second capacity insulator film formed on a first capacity insulator film.

Figure 7:
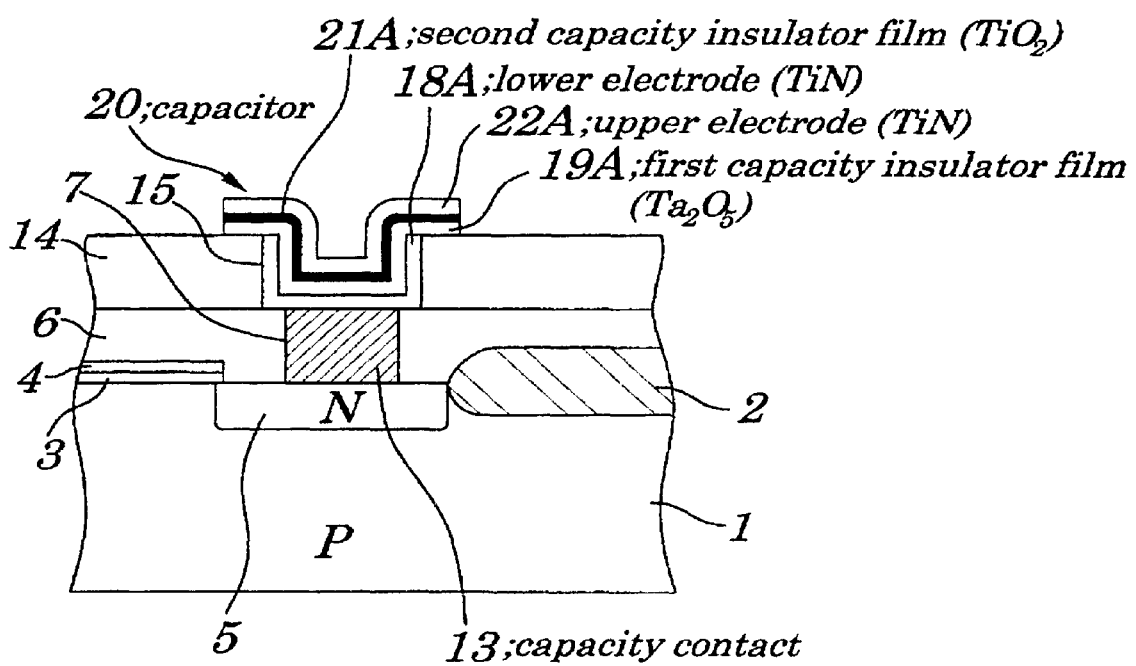
FIG. 7 is a cross-sectional view showing a configuration of a semiconductor device according to a second embodiment of the present invention.

As shown in FIG. 7, in the semiconductor device according to this embodiment, a capacitor 20 comprises a lower electrode 18A consisting of a titanium oxide film, a first capacity insulator film 19A consisting of a tantalum oxide film formed on this lower electrode 18A, a second capacity insulator film 21A consisting of a titanium oxide film formed to a thickness of 0.2 to 1.0 nm on this first capacity insulator film 19A, and an upper electrode 22A consisting of a titanium oxide film formed on this second capacity insulator film 21A.

The above-mentioned value, 0.2 to 1.0 nm, of the film thickness of the second capacity insulator film 21A consisting of a titanium oxide film provides a condition required to improve leakage-current characteristic without reducing capacitance of the capacitor 20 for almost a same reason with the first embodiment. That is, if the film thickness of the second capacity insulator film 21A is less than 0.2 nm, the capacitor 20 has a larger capacitance but, undesirably, its leakage current exceeds an allowable value. If that film thickness of the second capacity insulator film 21A exceeds 1 nm, on the other hand, the capacitor 20 has a smaller capacitance undesirably.

Figure 8A:
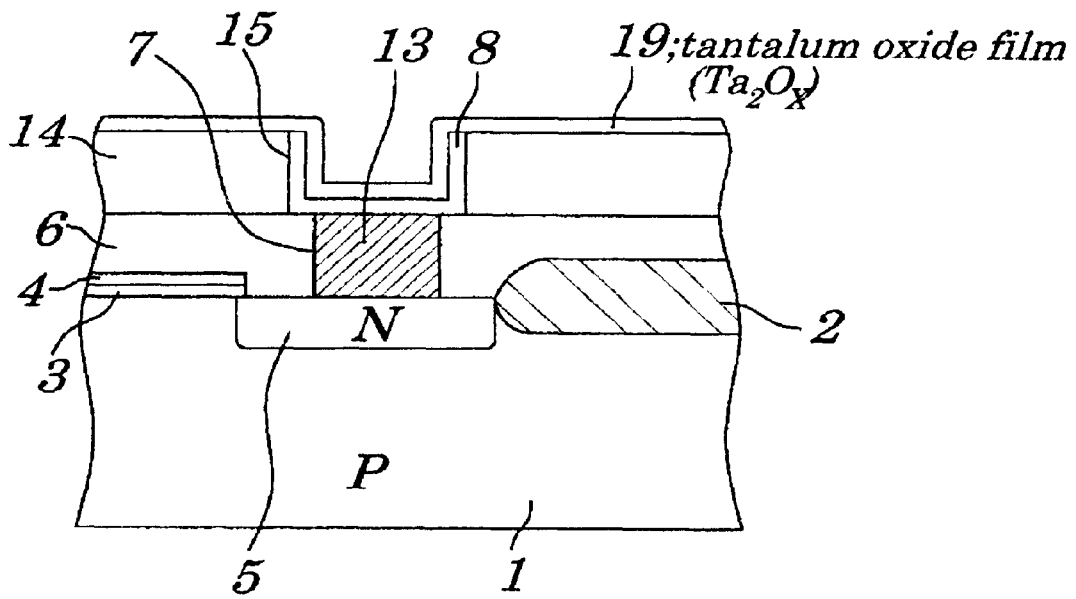
FIGS. 8A and 8B are flow diagrams showing a method for manufacturing the semiconductor of FIG. 7.
Figure 8B:
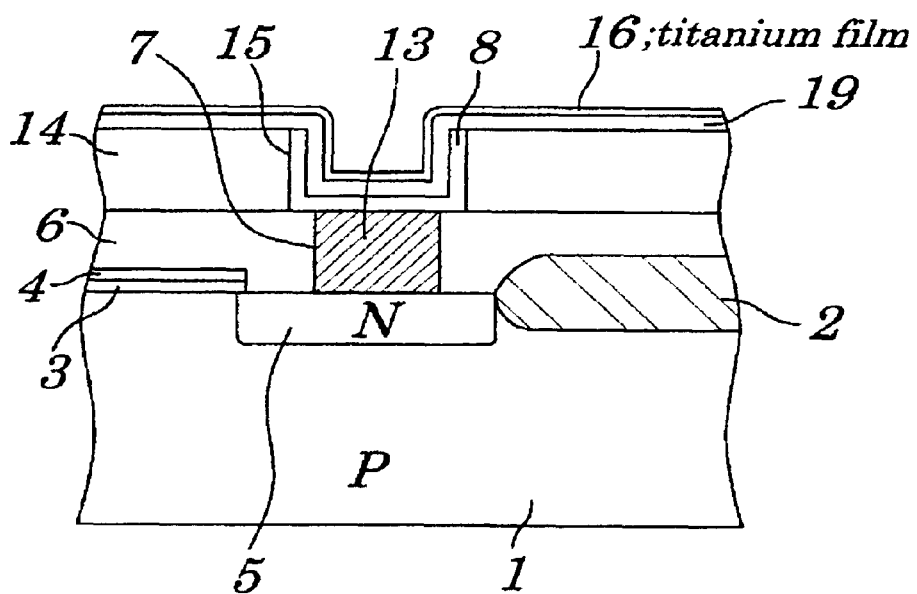
Figure 8C:
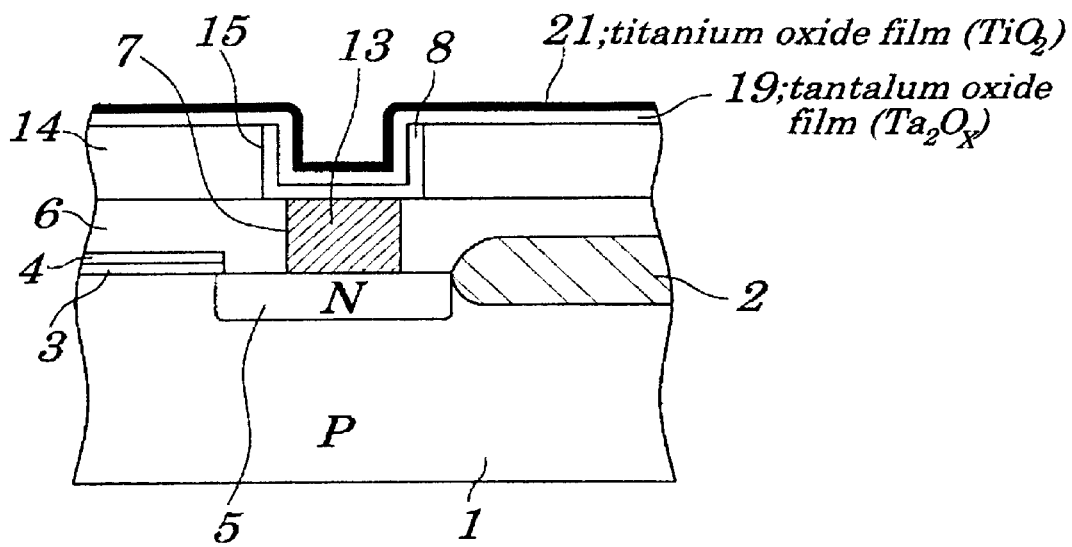
FIGS. 8C and 8D are continued flow diagrams showing the method for manufacturing the semiconductor device of FIG. 7.

The following will describe a method for manufacturing this semiconductor device along its steps with reference to FIGS. 8A and 8B.

Figure 11:
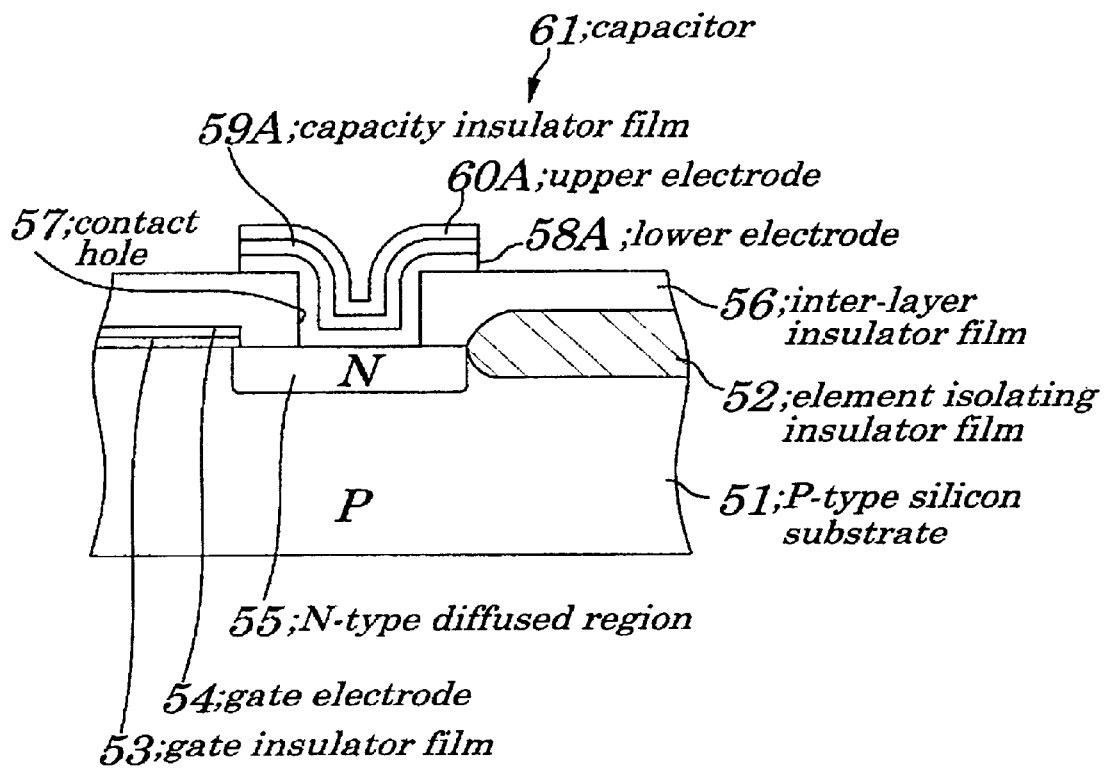
FIG. 11 is a cross-sectional view showing a configuration of a prior art semiconductor device.

First, when the process has passed through almost same contents as those of the steps of FIGS. 6A to 6D according to the first embodiment, as shown in FIG. 11A, a silicon substrate 1 is put into a CVD apparatus, in which a tantalum oxide film 19 is formed throughout on a surface to a thickness of about 8 nm to provide the first capacity insulator film 19A (FIG. 7) under the conditions that a tantalum penta-ethoxide gas is supplied as a source gas at a temperature of about 430° C. and a pressure of about 53.2 Pa (Pascal). This tantalum oxide film 19, however, is not sufficiently oxidized (that is, $x \leq 4$ for $Ta_2O_x$) in many cases and so needs to be subsequently oxidized sufficiently and modified into a stable film ($Ta_2O_5$).

Figure 12:
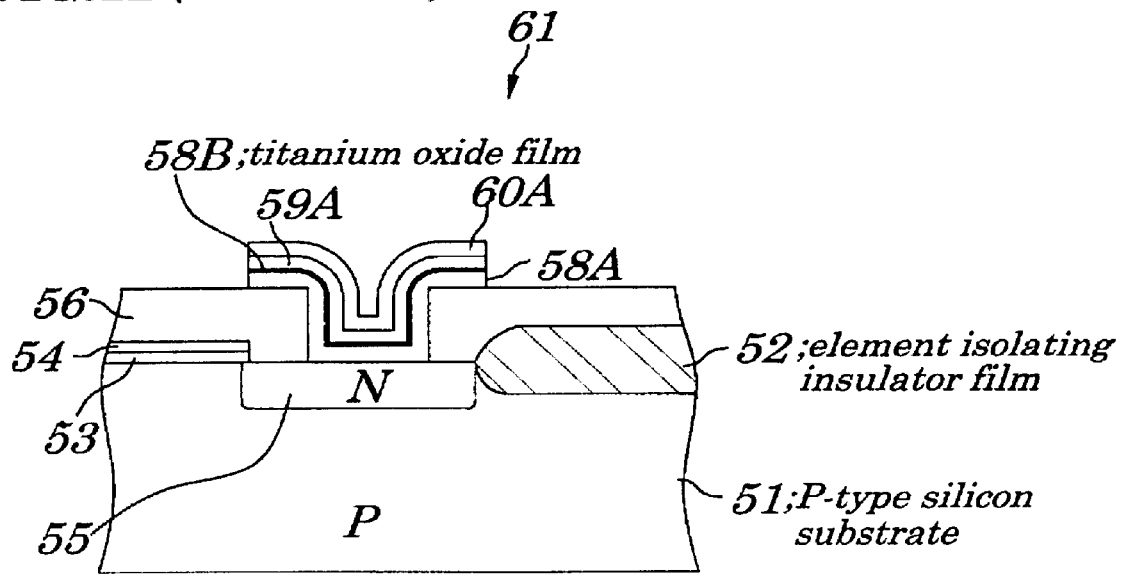
FIG. 12 is a cross-sectional view showing a disadvantage of the semiconductor device of FIG. 11.
Figure 13A:
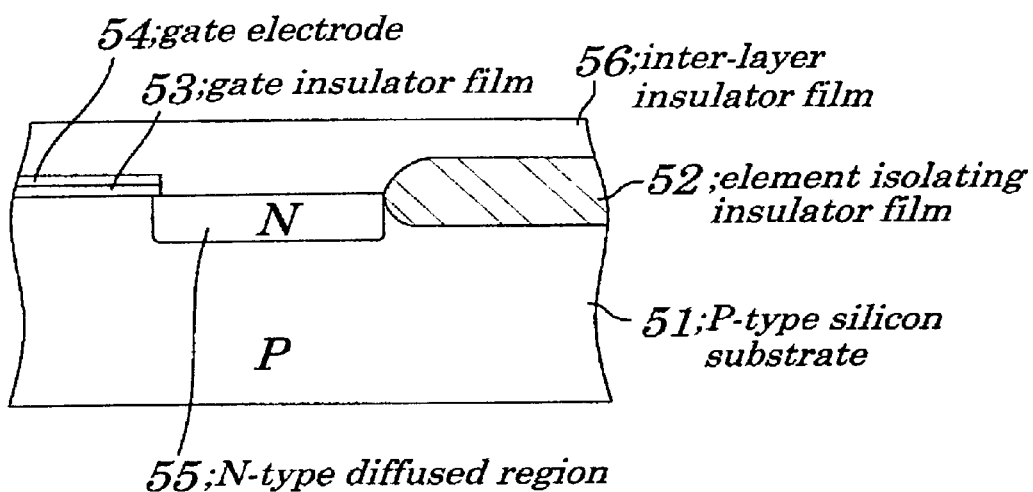
FIGS. 13A and 13B are flow diagrams showing a method for manufacturing the semiconductor device of FIG. 11.
Figure 13B:
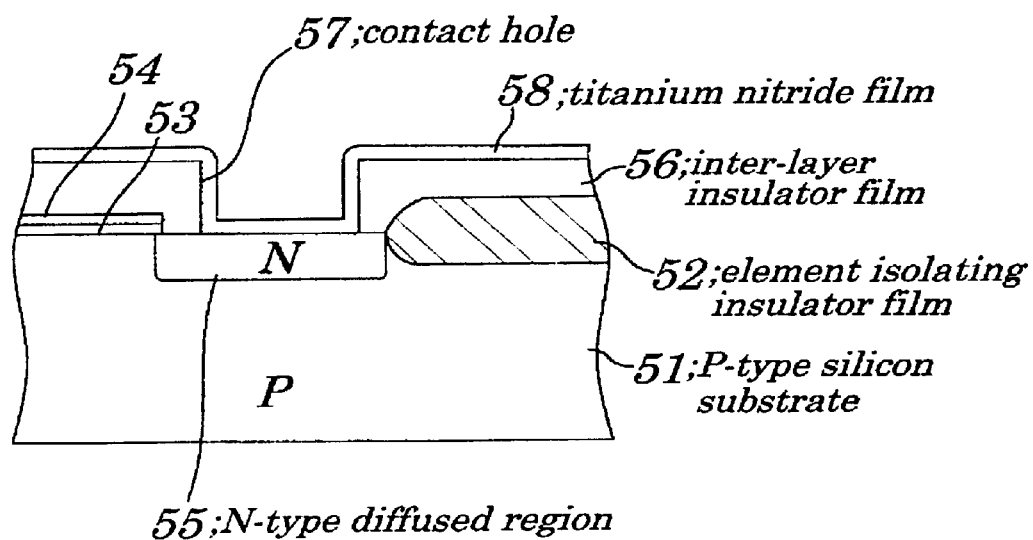
Figure 13C:
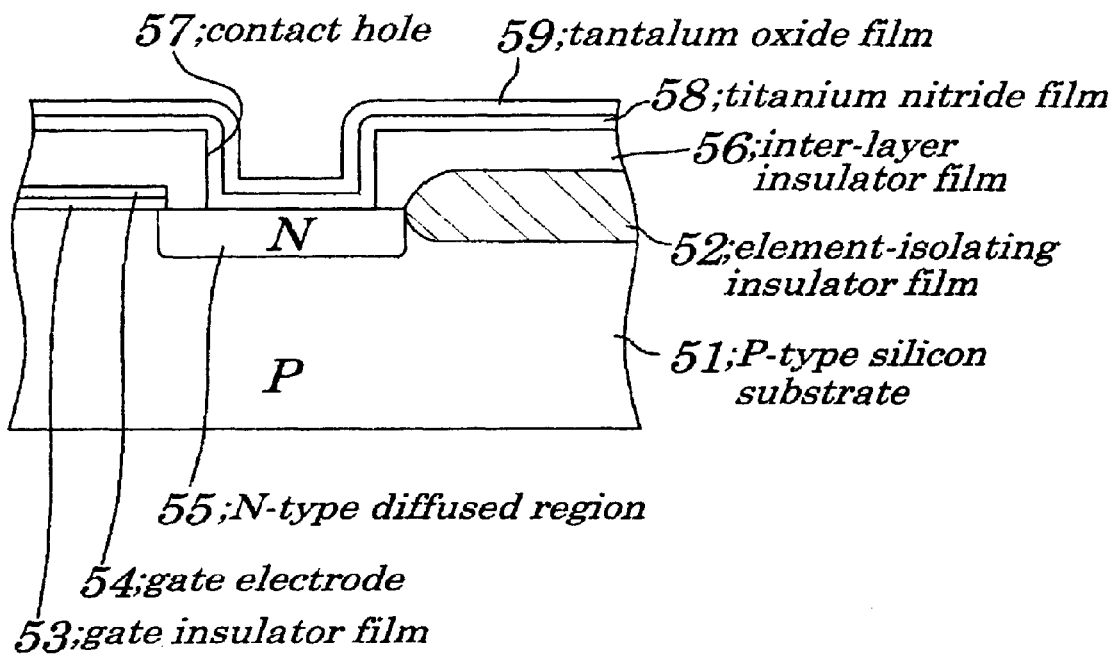
FIGS. 13C and 13D are continued flow diagrams showing the method for manufacturing the semiconductor device of FIG. 11.
Figure 13D:
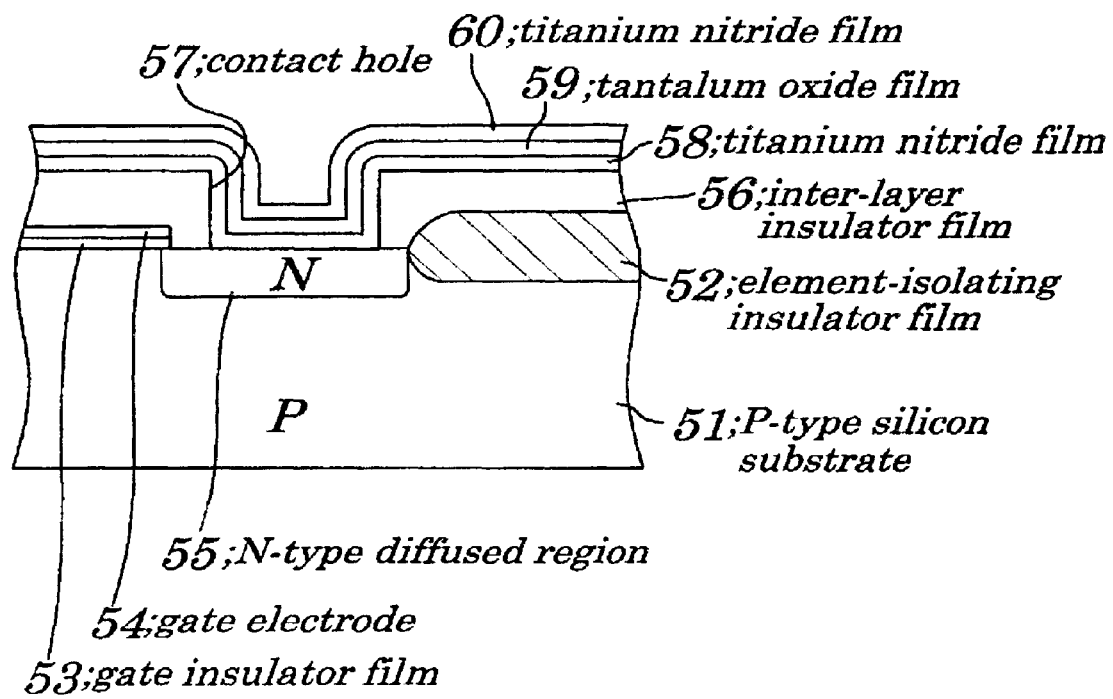
Figure 14:
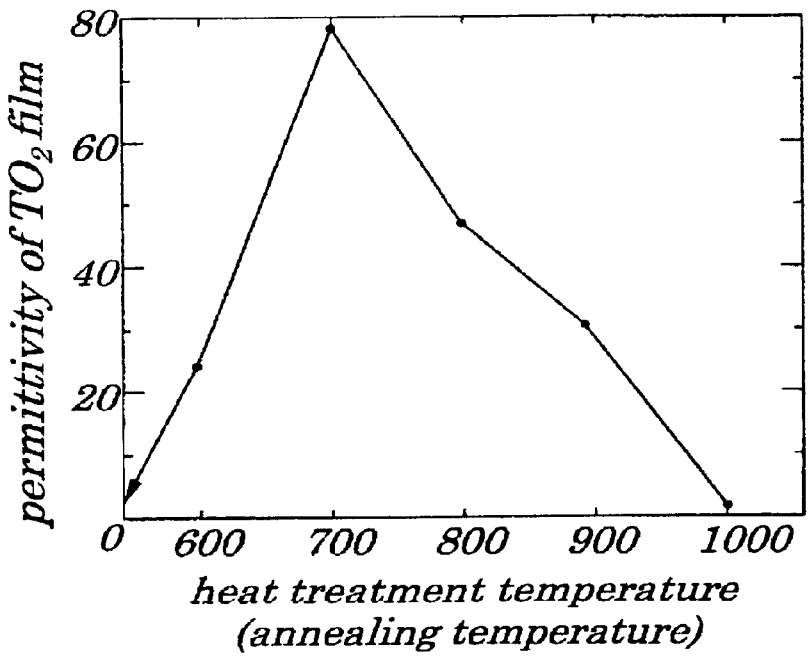
FIG. 14 is a graph showing a relationship between a heat treatment temperature (horizontal axis) and a permittivity (vertical axis) of a titanium oxide film constituting a capacitor of the semiconductor device of FIG. 11.

Next, as shown in FIG. 8B, a titanium film 16 is formed by CVD or a like to a thickness of 0.2 to 0.8 nm throughout on the surface. Next, as shown in FIG. 12C, heat treatment is performed on the silicon substrate 1 in a UV-$O_3$ oxidizing atmosphere at a temperature of about 400° C. for about five minutes. This oxidation, although it is weak, sufficiently oxidizes the above-mentioned tantalum oxide film not yet oxidized sufficiently, to modify it into a stable film. Also, during this oxidation, the titanium film 16 is completely oxidized to form a titanium oxide film 21 to a thickness of 0.2 to 1.0 nm on the tantalum oxide film 19. This titanium oxide film 21 serves as the second capacity insulator film 21A (FIG. 7).

Figure 8D:
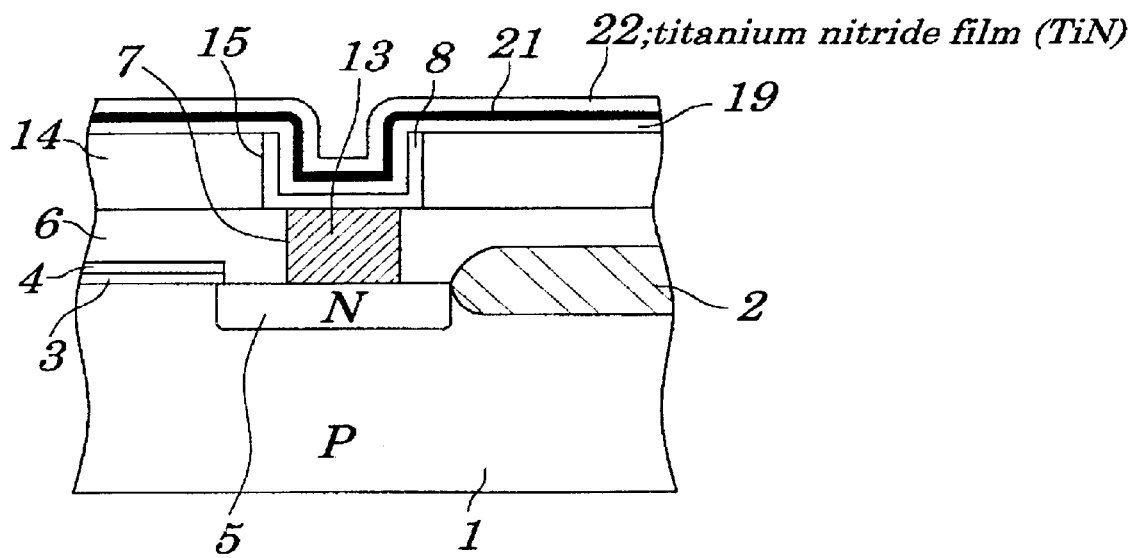

Next, as shown in FIG. 8D, a titanium nitride film 22 is formed by CVD or the like on the titanium oxide film 21 to provide the upper electrode film 22A (FIG. 7). Next, the tantalum oxide film 19, the titanium oxide film 21, and the titanium nitride film 22 are patterned by photolithography to form the upper electrode 22A, thus completing such the semiconductor device with the capacitor 20 as shown in FIG. 7.

The contents other than the above are almost same as those of the first embodiment. Therefore, the elements in FIG. 7 which correspond to those in FIG. 1 are indicated by same reference numerals as those in FIG. 1 and so omitted in description.

Thus, according to the semiconductor device having the above-mentioned configuration of this embodiment, the capacitor 20 comprises the lower electrode 18A consisting of a titanium nitride, the first capacity insulator film 19A consisting of a titanium oxide formed on this lower electrode 18A, the second capacity insulator film 21A consisting of a titanium oxide formed to a thickness of 0.2 to 1.0 nm on this first capacity insulator film 19A, and the upper electrode 22A consisting of a titanium nitride formed on this second capacity insulator film 21A, so that a small film thickness calculated as silicon oxide film is enough to reduce leakage current while suppressing a decrease in capacitance of the capacitor 20 as much as possible.

Also, according to the method for manufacturing the semiconductor device according to the above-mentioned configuration of this embodiment, after a titanium nitride film 8 is formed to provide the lower electrode 18A, the tantalum oxide film 19 and the titanium film 16 are formed to provide the first capacity insulator film 19A and the second capacity insulator film 21A respectively, to subsequently oxidize this titanium film 16 in order to form the second capacity insulator film 21A consisting of a titanium oxide film 19 to a thickness of 0.2 to 1.0 nm on the first capacity insulator film 19A, thus making it possible to manufacture the capacitor easily without requiring any special steps.

Thus, the configuration according to this embodiment also provides almost same effects as those described in the first embodiment.

In addition, according to the configuration of this embodiment, the oxidation step need not be repeated after the capacity insulator film is formed, thus making it possible to reduce the number of steps required and to produce thus decreasing costs.

Third Embodiment

A Configuration of a semiconductor device according to a third embodiment largely differs from that of the above-mentioned first embodiment in a respect that a capacitor is so formed as to be directly connected to a diffused region.

Figure 9:
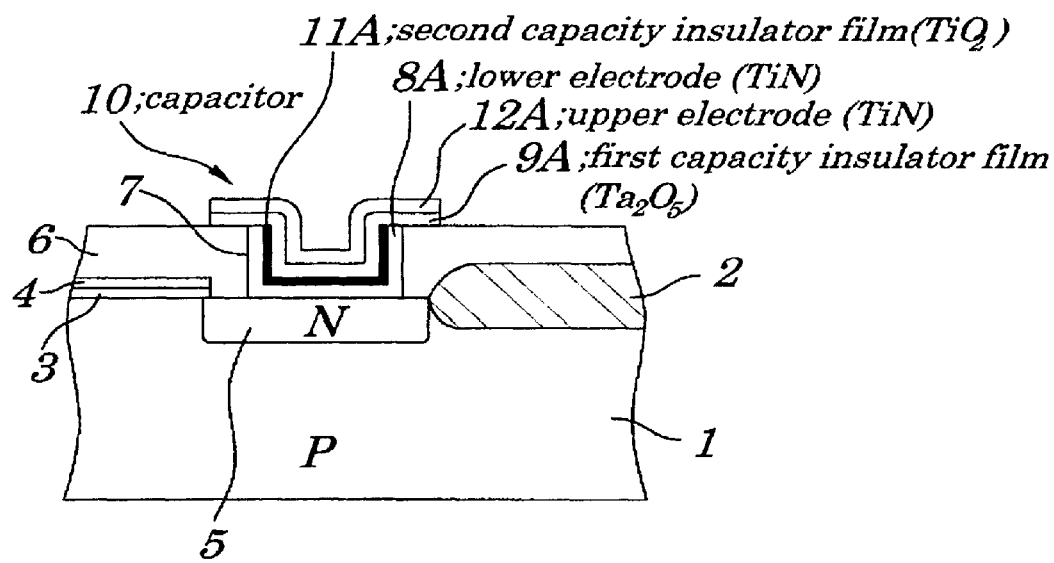
FIG. 9 is a cross-sectional view showing a semiconductor device according to a third embodiment of the present invention.

As shown in FIG. 9, in the semiconductor device according to this embodiment, a capacitor 10 comprises a lower electrode 8A consisting of a titanium nitride, a first capacity insulator film 9A consisting of a tantalum nitride formed on this lower electrode 8A, a second capacity insulator film 11A consisting of a titanium oxide formed to a thickness of 0.2 to 1.0 nm on an interface of this first capacity insulator film and the lower electrode 8A, and an upper electrode 12A consisting of a titanium nitride formed on the first capacity insulator film 9A in such a configuration that the lower electrode 8A is directly connected to an N-type diffused region 5.

The contents other than the above are almost same as those of the above-mentioned first embodiment. Therefore, elements in FIG. 9 which correspond to those in FIG. 1 are indicated by same reference numerals as those in FIG. 1 and so omitted in description.

Thus, the configuration according to this embodiment also makes it possible to obtained almost same effects as those described in the first embodiment.

In addition, according to the configuration of this embodiment, the capacitor is directly connected to the diffused region, thus making it possible to reduce number of the steps required.

Fourth Embodiment

A configuration of a semiconductor device according to this embodiment largely differs from that of the above-mentioned second embodiment in a respect that a capacitor is so formed as to be directly connected to a diffused region.

Figure 10:
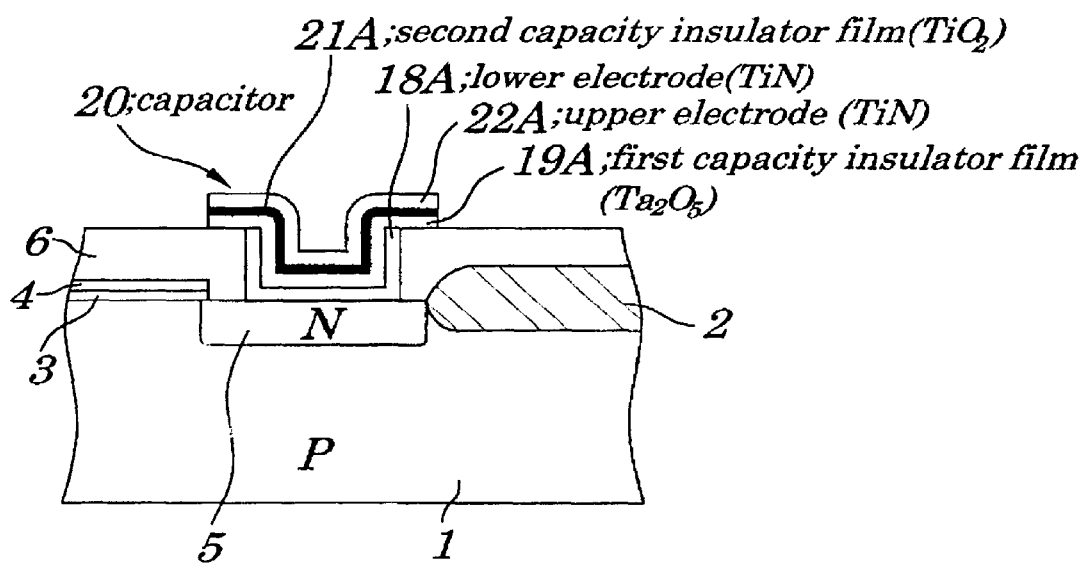
FIG. 10 is a cross-sectional view showing a semiconductor device according to a fourth embodiment of the present invention.

As shown in FIG. 10, in the semiconductor according to this embodiment, a capacitor 20 comprises a lower electrode 18A consisting of a titanium nitride, a first capacity insulator film 19A consisting of a tantalum oxide formed on this lower electrode 18A, a second capacity insulator film 21A consisting of a titanium oxide film formed to a thickness of 0.2 to 1.0 nm on this first capacity insulator film 19A, and an upper electrode 22A consisting of a titanium nitride film formed on this second capacity insulator film 21A in such a configuration that the lower electrode 18A is directly connected to an N-type diffused region 5.

The contents other than the above are almost same as those described in the above-mentioned second embodiment. Therefore, the elements in FIG. 10 which correspond to those in FIG. 7 are indicated by same reference numerals as those in FIG. 1 and so omitted in description.

Thus, the configuration according to this embodiment also makes it possible to obtain almost same effects as those described in the second embodiment.

In addition, according to the configuration of this embodiment, the capacitor is directly connected to the diffused region, thus making it possible to reduce number of steps required.

It is apparent that the present invention is not limited to the above embodiments but may be changed and modified without departing from the scope and spirit of the invention. For example, the lower and upper electrode film may be made, in addition to titanium nitride, of tungsten nitride or tungsten or other metal materials. Also, the capacity insulator film may be made, in addition to tantalum oxide, of BST [(BaSr) $TiO_3$], PZT [(Pb(ZrTi)$O_3$)] and other high-permittivity insulator materials. Also, the second capacity insulator film employed in the second and fourth embodiments may be made of tantalum or any other metal materials as far as they are capable of forming a metal film.

Also, the method for oxidizing the capacity insulator film or the metal film to thus form the second capacity insulator film may use an oxygen plasma apparatus. In this case, oxidation can be performed under the conditions of a plasma power of about 300 W, a pressure of about 53 Pa, and a substrate temperature of about 300° C. Similarly, the method for forming the second capacity insulator film may employ a remote plasma apparatus. In this case also, processing can be performed under almost same conditions as those for the above-mentioned plasma apparatus. In the case where the remote plasma apparatus is used, in particular, plasma is excited far away from the semiconductor substrate, thus effectively mitigating damages to the semiconductor substrate.

Also, the invention is applicable not only to a case of manufacturing DRAMs but also to a case of forming a discrete capacitor as far as it is to be created on a semiconductor substrate. Also, the conductive films, the film thicknesses of the insulator films or a like, the forming methods, or a like are not limited to the above-mentioned one example but are subject to change depending on applications, purposes, or a like. Also, the gate oxide film may consist not only of an oxide film but also of a nitride film or even a double configuration of an oxide film and a nitride film. That is, the transistors employed in the invention may be not only MOS-type ones but also Metal Nitride Semiconductor (MNS)-type ones or Metal Nitride Oxide Semiconductor (MNOS)-type ones as far as they are of MIS-type. Also, the conductivity type of those semiconductor regions may be reversed between P-type and N-type. That is, the invention is applicable not only to N-channel transistors but also to P-channel MIS-type transistors.

What is claimed is:

1. A semiconductor device provided with a capacitor which is so formed as to be connected to one diffused region on a semiconductor substrate, said capacitor comprising:

a lower electrode comprising a metal film which is so formed as to be connected to said one diffused region;

a first capacity insulator film comprising tantalum oxide formed on said lower electrode;

a second capacity insulator film comprising an oxide film, made from said metal film of said lower electrode, formed at an interface between said first capacity insulator film and said lower electrode, which has a lower permittivity than said first capacity insulator film, and which has a predetermined film thickness; and an upper electrode comprising a metal film formed on said first capacity insulator film.

2. The semiconductor device according to claim 1, wherein said lower electrode is connected through a capacity contact to said one diffused region.

3. The semiconductor device according to claim 1, wherein said lower electrode or said upper electrode is made of titanium nitride, titanium, tungsten nitride, or tungsten.

4. The semiconductor device according to claim 1, wherein said second capacity insulator film is made of titanium oxide and has a film thickness of 0.2 to 1.0 nm.

5. A semiconductor device provided with a capacitor which is so formed as to be connected to one diffused region on a semiconductor substrate, said capacitor comprising:

a lower electrode comprising a metal film which is so formed as to be connected to said one diffused region;

a first capacity insulator film comprising tantalum oxide formed on said lower electrode;

a second capacity insulator film comprising a metal oxide film formed on said first capacity insulator film, which has a lower permittivity than said first capacity insulator film, and which has a predetermined film thickness; and an upper electrode comprising a metal film formed on said first capacity insulator film.

6. The semiconductor device according to claim 5, wherein said lower electrode is connected through a capacity contact to said one diffused region.

7. The semiconductor device according to claim 5, wherein said lower electrode or said upper electrode is made of titanium nitride, titanium, tungsten nitride, or tungsten.

8. The semiconductor device according to claim 5, wherein said second capacity insulator film is made of titanium oxide and has a film thickness of 0.2 to 1.0 nm.

* * * * *

UNITED STATES PATENT AND TRADEMARK OFFICE
CERTIFICATE OF CORRECTION

PATENT NO. : 6,627,939 B2
APPLICATION NO. : 09/732703
DATED : September 30, 2003
INVENTOR(S) : Hiromu Yamaguchi It is certified that error appears in the above-identified patent and that said Letters Patent is hereby corrected as shown below:

Col. 15, line 39, delete "comprising" and insert --consisting of--;
Col. 15, line 41, delete "comprising" and insert --consisting of--;
Col. 16, line 1, delete "comprising" and insert --consisting of--;
Col. 16, line 7, delete "comprising" and insert --consisting of--;
Col. 16, lines 15-17, delete "The semiconductor device according to claim 1, where in said second capacity insulator film is made of titanium oxide and has a film thickness of 0.2 to 1.0 nm."

and insert --A semiconductor device provided with a capacitor which is so formed as to be connected to one diffused region on a semiconductor substrate, said capacitor comprising:

a lower electrode comprising a metal film which is so formed as to be connected to said one diffused region;

a first capacity insulator film comprising tantalum oxide formed on said lower electrode;

a second capacity insulator film being made of titanium oxide and having a film thickness of 0.2 to 1.0 nm, made from said metal film of said lower electrode, formed at an interface between said first capacity insulator film and said lower electrode, which has a lower permittivity than said first capacity insulator film, and which has a predetermined film thickness; and an upper electrode comprising a metal film formed on said first capacity insulator film--

Col. 16, lines 38-40, delete " The semiconductor device according to claim 5, wherein said second capacity insulator film is made of titanium oxide and has a film thickness of 0.2 to 1.0nm.

and insert --A semiconductor device provided with a capacitor which is so formed as to be connected to one diffused region on a semiconductor substrate, said capacitor comprising:

a lower electrode comprising a metal film which is so formed as to be connected to said one diffused region;

a first capacity insulator film comprising tantalum oxide formed on said lower electrode;

UNITED STATES PATENT AND TRADEMARK OFFICE
CERTIFICATE OF CORRECTION

PATENT NO. : 6,627,939 B2  
APPLICATION NO. : 09/732703  
DATED : September 30, 2003  
INVENTOR(S) : Hiromu Yamaguchi Page 2 of 2

It is certified that error appears in the above-identified patent and that said Letters Patent is hereby corrected as shown below:

a second capacity insulator film being made of titanium oxide and having a film thickness of 0.2 to 1.0 nm formed on said first capacity insulator film, which has a lower permittivity than said first capacity insulator film, and which has a predetermined film thickness; and an upper electrode comprising a metal film formed on said second capacity insulator film.--

Col. 16, line 21, delete "comprising" and insert --consisting of--  
Col. 16, line 23, delete "comprising" and insert --consisting of--  
Col. 16, line 25 delete "comprising" and insert --consisting of--  
Col. 16, line 30 delete "comprising" and insert --consisting of--  
Col. 16, line 13, delete "first" and insert --second--.

Signed and Sealed this

Eighth Day of August, 2006

JON W. DUDAS  
*Director of the United States Patent and Trademark Office*